United States Patent

Hashimoto et al.

[11] Patent Number: 5,835,996
[45] Date of Patent: Nov. 10, 1998

[54] POWER GENERATION METHOD AND POWER GENERATOR USING A PIEZOELECTRIC ELEMENT, AND ELECTRONIC DEVICE USING THE POWER

[75] Inventors: Yasuharu Hashimoto; Osamu Takahashi; Hajime Miyazaki; Tsukasa Funasaka; Makoto Furuhata, all of Suwa, Japan

[73] Assignee: Seiko Epscon Corporation, Tokyo, Japan

[21] Appl. No.: 768,501

[22] Filed: Dec. 18, 1996

[30] Foreign Application Priority Data

Dec. 18, 1995 [JP] Japan .................................. 7-329348
Nov. 11, 1996 [JP] Japan .................................. 8-298975

[51] Int. Cl.⁶ ............................. H03H 5/00; H01L 41/04
[52] U.S. Cl. ............................................ 323/364; 310/319
[58] Field of Search ................................ 323/364, 368; 310/311, 314, 319, 320

[56] References Cited

U.S. PATENT DOCUMENTS

| | | | |
|---|---|---|---|
| 3,666,976 | 5/1972 | Gourlay et al. | 310/8.8 |
| 3,762,941 | 10/1973 | Hou | 117/93.1 |
| 4,012,307 | 3/1977 | Phillips | 204/192 |
| 4,430,547 | 2/1984 | Yoneda et al. | 219/121 |
| 4,705,593 | 11/1987 | Haigh et al. | 156/635 |
| 4,708,766 | 11/1987 | Hynecek | 156/643 |
| 4,749,440 | 6/1988 | Blackwood et al. | 156/646 |
| 4,786,836 | 11/1988 | Tokushima | 310/323 |
| 4,857,382 | 8/1989 | Liu et al. | 428/156 |
| 4,921,157 | 5/1990 | Dishon et al. | 228/124 |
| 5,000,819 | 3/1991 | Pedder et al. | 156/643 |
| 5,045,166 | 9/1991 | Bobbio | 204/192 |
| 5,120,568 | 6/1992 | Schuurmans et al. | 427/37 |
| 5,126,164 | 6/1992 | Okazaki et al. | 427/39 |
| 5,147,520 | 9/1992 | Bobbio | 204/192 |
| 5,178,682 | 1/1993 | Tsukamoto et al. | 118/722 |
| 5,201,995 | 4/1993 | Reisman et al. | 156/646 |
| 5,225,659 | 7/1993 | Kusano et al. | 249/121 |
| 5,240,559 | 8/1993 | Ishida | 456/666 |
| 5,290,378 | 3/1994 | Kusano et al. | 156/272 |
| 5,292,370 | 3/1994 | Tsai et al. | |
| 5,316,739 | 5/1994 | Yoshikawa et al. | 422/186 |
| 5,340,618 | 8/1994 | Tanisaki et al. | 427/488 |
| 5,368,685 | 11/1994 | Kumihashi et al. | 156/643 |
| 5,384,167 | 1/1995 | Nishiwaki et al. | 427/569 |
| 5,391,855 | 2/1995 | Tanisaki . | |
| 5,399,830 | 3/1995 | Maruyama . | |
| 5,407,121 | 4/1995 | Koopman et al. | 228/206 |
| 5,449,432 | 9/1995 | Hanawa . | |
| 5,499,754 | 3/1996 | Bobbio et al. | 228/42 |
| 5,597,438 | 1/1997 | Grewal et al. . | |
| 5,656,881 | 8/1997 | Atsuta | 310/316 |

FOREIGN PATENT DOCUMENTS

| | | |
|---|---|---|
| 3671693 | 6/1990 | European Pat. Off. . |
| 59-158525 | 9/1984 | Japan . |
| 60-1861 | 1/1985 | Japan . |
| 61-127866 | 6/1986 | Japan . |
| 2-190489 | 7/1990 | Japan . |
| 2-281734 | 11/1990 | Japan . |
| 3-174972 | 7/1991 | Japan . |
| 3-219082 | 9/1991 | Japan . |
| 3-236475 | 10/1991 | Japan . |
| 4-186619 | 7/1992 | Japan . |
| 6-190269 | 12/1992 | Japan . |
| 5-82478 | 4/1993 | Japan . |
| 6-2149 | 1/1994 | Japan . |

*Primary Examiner*—Adolf Berhane
*Attorney, Agent, or Firm*—Stroock & Stroock & Lavan LLP

[57] ABSTRACT

A power generator using a piezoelectric element is provided which generates electric power at a high efficiency. It has been determined that the efficiency of power generation varies as a function of the ratio of an initial unloaded value of the power generator to a prescribed voltage of the input of an electric power system. A high power generation efficiency can be obtained when the voltage ratio is in the range of approximately two to twenty. In particular, when the voltage ratio is in the range of approximately four to six, a maximum power generation efficiency can be obtained. The invention provides a small-sized, high performance power generator which can be used in practice in portable electronic devices or the like.

26 Claims, 14 Drawing Sheets

FIG.1
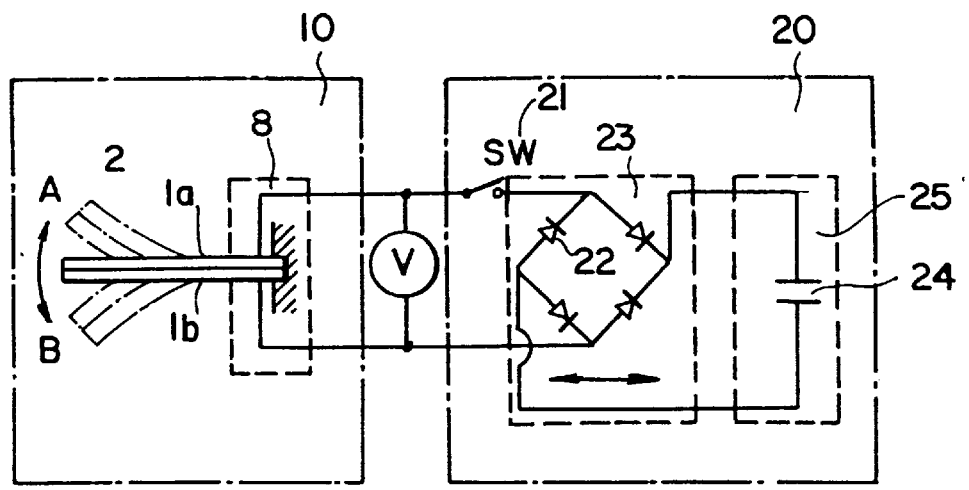
PRIOR ART
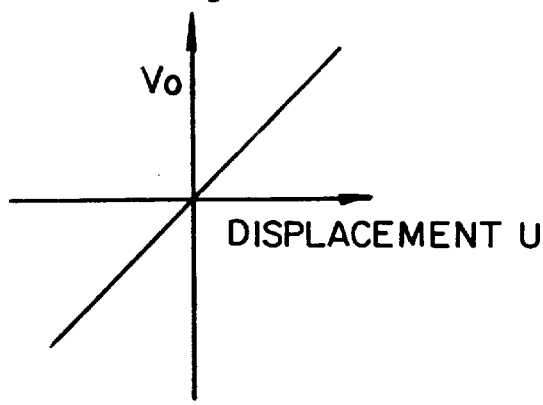
FIG 2(a)
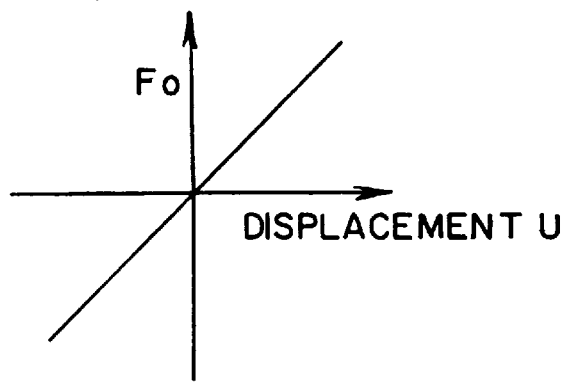
FIG 2(b)

FIG. 16

POWER GENERATION METHOD AND POWER GENERATOR USING A PIEZOELECTRIC ELEMENT, AND ELECTRONIC DEVICE USING THE POWER

BACKGROUND OF THE INVENTION

1. Field of the Invention

The present invention relates to a power generation method and a power generator using a piezoelectric element, and an electronic device which operates utilizing the electric power generated by this power generator.

2. Description of the Related Art

FIG. 1 depicts a general arrangement of a power generator using electric power generated by a piezoelectric effect caused when a piezoelectric element is displaced and vibrates. A power generator 10 comprises a vibrator 2 provided with a piezoelectric element 1, such as PZT (trade name). Vibrator 2 shown in FIG. 1 is formed in the shape of a bimorph-type cantilevered beam provided with two piezoelectric layers 1a and 1b. Thus, when vibrator 2 is displaced or vibrated in the directions indicated by arrows A and B in FIG. 1 respective piezoelectric layers 1a and 1b are repeatedly compressed and tensioned. As a result, a voltage corresponding to the direction of their polarization is generated in piezoelectric layers 1a and 1b. Electric power collector 8, such as electrodes, are coupled with piezoelectric layers 1a and 1b, so as to supply electric power generated in piezoelectric element 1 to an external source. When vibrator 2 is displaced, in the directions indicated by arrows A or B in FIG. 1, by an external force, or when piezoelectric element 1 is displaced by self-excitation, which results in vibration or displacement, electric power generated in piezoelectric element 1 is supplied to an electric power system 20.

The arrangement of vibrator 2 is not limited to the example shown in FIG. 1, and may also be formed with a sandwich structure in which a support layer made of a metal or the like is interposed in the center of vibrator 2 between layers 1a and 1b, or a structure in which a piezoelectric element is attached to a part of a support beam made of metal or the like.

Further, in addition to the structure depicted in FIG. 1, which utilizes a cantilevered beam, vibrator 2 may be formed with other structure. For example, a vibrator which exerts a force in the direction of a twist through the use of a pendulum, a vibrator in the shape of a coil spring or a circular bimorph, or a vibrator which is combined into the shape of a tuning fork may be used so long as an elastic wave can be applied to the piezoelectric element.

The electro-mechanical coupling coefficient (hereinafter referred to as the "coupling coefficient") K of piezoelectric elements in general is very small. Thus, the ratio of the applied mechanical energy which is converted into electrical energy during any one displacement of the piezoelectric element is very small. Therefore, through repeated vibrations, mechanical energy is repeatedly converted into electrical energy from the vibrator so as to generate power efficiently.

A power generator 10 shown in FIG. 1 is connected to an electric power system 20 via a switch 21 for opening and closing an output from power generator 10. Electric power system 20 comprises a rectifying device 23 formed of a plurality of diodes 22, and an electric-charge storage device 25 for accumulating rectified electric power. A capacitor 24 or the like serves as the power storage device.

Power generator 10 may be directly connected to a processing unit which consumes electric power, such as a timer device or a personal computer or the like. However, in power generator 10 using a piezoelectric element, the generated electromotive voltage may vary due to the displacement of the vibrator, and therefore the generation of electric power may not be uniform and continuous in a portable electronic device. For this reason, generated electric power is preferably accumulated in capacitor 24. This accumulated electric power is supplied to a device requiring electric power via an electric-charge storage device which can supply the electric power at a predetermined voltage, for example, a capacitor voltage Vc.

When electric power is to be supplied from power generator 10 to electric power system 20, electric power system 20 cannot be charged unless at least a predetermined voltage Ve is generated by power generator 10 and input to electric power system 20. For example, voltage Ve must be equal to or greater than the sum (Vc+Vd) where a voltage Vc is the voltage level of capacitor 24 and Vd is the forward voltage level of the diode bridge of rectifying device 23. Since power generator 10 shown in FIG. 1 generates power through the displacement of vibrator 2, its electromotive voltage is nearly proportional to the displacement of vibrator 2. Therefore, in order to increase the electromotive voltage generated by vibrator 2, it is preferable that a large displacement be applied to vibrator 2. However, as the displacement of vibrator 2 during vibration increases, mechanical loss due to these vibrations increases, causing charging efficiency of the apparatus to decrease.

In a power generator using a piezoelectric element, an additional conventional method has been proposed in which the construction of the vibrator is improved so as to more efficiently convert mechanical energy into electrical energy. However, no examination has been made of the electromotive voltage of the piezoelectric element, or conditions suitable for power generation for increasing the conversion efficiency (power generation efficiency or charging efficiency) of the power generator.

Alternatively, rather than change the structure of the vibrator, the vibrator may be vibrated in a vibration mode in which attenuation is small. However, it has been determined that this method does not improve the efficiency of conversion from mechanical to electrical energy.

SUMMARY OF THE INVENTION

Generally speaking, in accordance with the invention, the power generation cycle using a piezoelectric element has been studied, and it has been determined that electric power can be supplied most efficiently when the unloaded voltage produced when electric power is generated through the displacement of a piezoelectric element is twice as great as the prescribed (loaded) voltage of the coupled electric power system. Thus, the efficiency of power generation can be increased in a power generation method in which a displacement is applied to a piezoelectric element and electric power generated thereby is supplied to an electric power system, by applying a displacement to the piezoelectric such that the unloaded voltage, which is the voltage of the piezoelectric element when no electrical load is coupled thereto, which is approximately two times as great as the prescribed (loaded) voltage of the electric power system supplied with power from the piezoelectric element. Therefore, a power generator for generating power at high efficiency is provided, comprising a piezoelectric element, a displacement applicator for applying a displacement to the piezoelectric element, and an electric power supplier for supplying electric power generated in the piezoelectric element to the electric power system. The displacement applicator applies a displacement such that the unloaded voltage is approximately twice as great as the prescribed (loaded) voltage.

It is important for increasing power generation efficiency that the displacement application step in which the unloaded voltage is twice as great as the prescribed (loaded) voltage is repeated quickly, continuously and accurately when electric power is supplied from a piezoelectric element, thereby continuously applying the proper displacement to the piezoelectric element. Therefore, in a piezoelectric element whose displacement is generated internally by its own weight or by displacement application means, such as a loaded weight, or in a piezoelectric element in which a displacement is generated by an external source such as impact or flexing the piezoelectric element, it is important that the displacement application means are able to rapidly and repeatedly apply a displacement such that the unloaded voltage is twice as great as the (loaded) prescribed voltage for providing a power generator having high power generation efficiency.

When an initial displacement is applied to the piezoelectric element, and electric power is generated by this initial displacement and the displacement thereafter repeated in subsequent free vibrations, it is preferable that the initial displacement be applied such that the unloaded voltage is at least two times as great as the prescribed (loaded) voltage. In a power generation method and a power generator in which electric power generated in a piezoelectric element is supplied based upon the displacement of the piezoelectric element and any subsequent free vibrations which are generated as a result of the initial displacement, a portion of the mechanical energy supplied to the piezoelectric element by the initial displacement is repeatedly converted into electrical energy during each vibration. Therefore, in comparison with a piezoelectric element in which subsequent free vibrations do not occur, the mechanical energy can be converted into electrical energy with a higher degree of efficiency. During these subsequent free vibrations, the displacement of the piezoelectric element gradually decreases after each vibration, and the unloaded voltage corresponding to this displacement gradually decreases. For this reason, in order to generate electric power more efficiently when utilizing this series of subsequent free vibrations resulting from an initial displacement, it is preferable that the unloaded voltage (the initial electromotive voltage) which is generated as a result of the initial displacement applied by impact or the like be higher than the above-described unloaded voltage at which efficiency reaches its maximum (i.e. more than double the prescribed voltage) so that a number or the subsequent free vibrations will take place and generate electricity at maximum efficiency.

However, if the initial displacement of the piezoelectric element is made too large in an effort to increase the initial electromotive voltage, the mechanical loss during electricity generation becomes large and efficiency is decreased. It is therefore not possible to increase efficiency of power generation using a series of free vibrations generated subsequent to an initial displacement of a piezoelectric element by merely increasing the initial displacement, and thus the initial electromotive voltage.

In accordance with the invention, the relationship shown in FIG. 7 between the initial electromotive voltage and the power generation efficiency (charging efficiency n) has been determined. FIG. 7 depicts the charging efficiency n when there is no electrical load caused by the initial displacement of the piezoelectric element. When the value Vof of the unloaded voltage (the initial electromotive voltage) of the piezoelectric element, in which an electrical load is not connected, is in the range of approximately 2 to 20 times as great as the prescribed voltage Ve of the electric power system no electrical load is caused by the initial displacement. In particular, the peak of the charging efficiency appears when the initial electromotive voltage (the initial value of the unloaded voltage) is in the range of approximately 4 to 6 times as great as the prescribed voltage Ve. Therefore, generation of electric power can be performed with high efficiency by applying an initial displacement so that the initial electromotive voltage Vof falls within this range.

Provision of displacement application means capable of applying an initial displacement which results in an initial electromotive voltage Vof within the preferred range makes it possible to provide a power generator which generates power at a high power generation efficiency. Through this invention, it is possible to provide a power generator capable of generating electric power at a peak power generation efficiency of approximately 70% or more by setting the initial electromotive voltage Vof in the range of approximately 2 to 15 times as great as the prescribed voltage Ve. Therefore, in a power generator using a piezoelectric element of a self-excited or externally excited type which can perform generation of electric power continuously for a certain period of time, a power generation method and a power generator which are capable of consistently and repeatedly applying an initial displacement such that the initial electromotive voltage Vof falls in the range of 2 to 20 times as great as the prescribed voltage are preferable; a power generation method and a power generator which are capable of consistently and repeatedly applying an initial displacement such that the initial electromotive voltage falls in the range of 2 to 15 times as great as the prescribed voltage are more preferable; and a power generation method and a power generator which are capable of consistently and repeatedly applying an initial displacement such that the initial electromotive voltage falls in the range of 4 to 6 times as great as the prescribed voltage are still more preferable. Power generation under these conditions makes it possible to provide a small, portable, high-performance power generator suitable for portable devices.

Therefore, by incorporating rectifying means for rectifying electric power supplied from the power generator, electric-charge storage means for accumulating rectified electric power and a processing unit capable of operating by utilizing the rectified electric power, it is possible to provide a portable power generator for powering a processing unit which can properly operate anytime and anyplace without batteries.

Accordingly, it is an object of the invention to provide a power generation method and a power generator having a high power generation efficiency by using a piezoelectric element. It is another object of the present invention to provide a small, high-performance power generator which utilizes a piezoelectric element which can be used in practice in portable devices.

A further object of the invention is to provide a suitable portable electronic device in which a power generator and a processing unit are incorporated, generating power at high efficiency to ran the process unit.

Still other objects and advantages of the invention will in part be obvious and will in part be apparent from the specifications and drawings.

This invention accordingly comprises the several steps and the relation of one or more of such steps with respect to each of the others, and the apparatus embodying features of construction, combinations of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1 is a schematic drawing showing the general arrangement of a power generator generating electric power through the vibration of a vibrator provided with a piezoelectric element coupled thereto;

FIG. 2A is a graph depicting the relationship between an output voltage Vo and a displacement u of the vibrator when the output end of the power generator shown in FIG. 1 is unloaded;

FIG. 2B is a graph depicting the relationship between a force Fo applied to the vibrator and a displacement u of the vibrator when the output end of the power generator shown in FIG. 1 is unloaded;

FIG. 16 is a top plan view of another embodiment of a wrist watch provided with a power generator constructed in accordance with the invention to which an initial displacement is applied by a force against the power generator;

DESCRIPTION OF THE PREFERRED EMBODIMENTS

Figure 3:
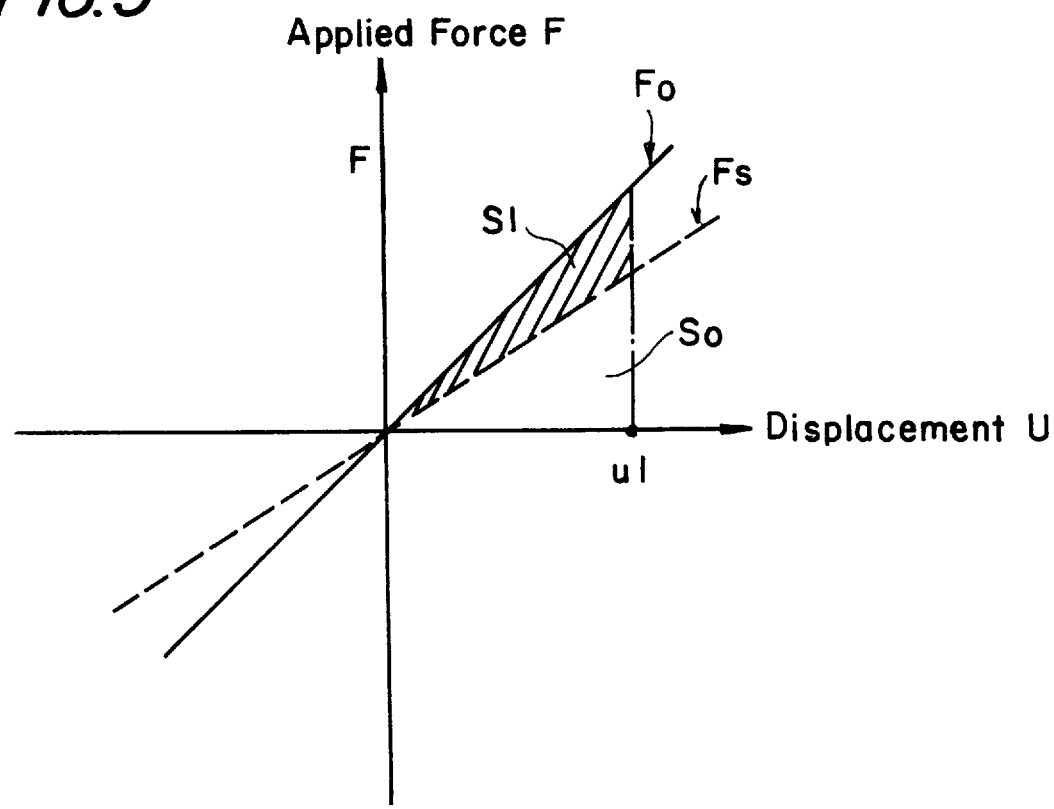
FIG. 3 is a graph depicting the relationship between a force Fo applied to the vibrator when the power generator shown in FIG. 1 is unloaded and a force Fs applied to the vibrator when the output end of the power generator shown in FIG. 1 is loaded.

The present invention will now be described making reference to the accompanying drawings. As noted above, FIG. 1 depicts the general arrangement of a power generator for generating power based upon a piezoelectric effect when the piezoelectric element is displaced. A power generator comprises a vibrator 2 with a piezoelectric element 1 coupled thereto. Piezoelectric element 1 is further formed of individual piezoelectric layers 1a and 1b fixed to each other. Vibrator 2 is further coupled with an electricity collector 8. Power generator 10 is further electrically coupled though a switch 21 with an electric power system 20, which is in turn formed of a plurality of diodes 22 forming a rectifying device 23, and an electric-charge storage device 25, comprising a capacitor 24, for accumulating and storing rectified electric power. As set forth above, during operation, vibrator 2 is displaced and vibrates. Electricity is collected by electricity collector 8, and is transferred through switch 21 to rectifying device 23. After being rectified, the electricity is stored in electric-charge storage device 25, and is available for use.

Referring next to FIGS. 2A and 2B, the relationship between an applied voltage Vo and an applied force F as a function of the displacement u of a vibrator 2 when switch 21 is opened in power generator 10 of FIG. 1 is depicted. When vibrator 2 is displaced in both the up and down direction (in the A and B direction in FIG. 1) and switch 21 is opened (in a no-load state in which an electrical load is not connected to power generator 10), the voltage Vo at the output end of power generator 10 as a function of the displacement u of vibrator varies in proportion to the displacement u of vibrator 2, as shown in FIG. 2A. Similarly, the force Fo applied to vibrator 2 as a function of the displacement u of vibrator 2 of the power generator 10 when switch 21 is opened and generator 10 is unloaded varies in proportion to the displacement u of vibrator 2, as shown in FIG. 2B.

Referring next to FIG. 3 in addition to FIGS. 2a and 2b, a force of Fs applied to vibrator 2 results in a displacement u of vibrator 2 when switch 21 is closed (in a state in which a load is connected to power generator 10). This displacement causes the voltage at the output end of power generator 10 to decrease and, therefore, the applied force Fs required to displace vibrator 2 is less than the force Fo which must be applied when switch 21 is opened (unloaded). When the output side of power generator 10 is loaded and switch 21 is closed, the output end voltage is drained to zero and is stored in storage means 25. Therefore, no force from the buildup of electric charge across electricity collector 8 must be overcome, and only a force which causes vibrator 2 to be mechanically deformed needs to be applied thereto which corresponds to force Fs which is less than force Fo.

As is further shown in FIG. 3 the solid line depicts the required applied force Fo as a function of the displacement u when the output end of the power generator 10 is unloaded and switch 21 is opened. The broken line depicts the required applied force Fs as a function of the displacement u when the output side is loaded, or short-circuited and switch 21 is closed. As can be seen in FIG. 3, the required applied force Fs when switch 21 is closed and power generator 10 is loaded is less than the required applied force Fo when switch 21 is opened and power generator is unloaded to displace vibrator 2 the same distance U. The difference between force Fo and FS is stored in vibrator 2 as electrical energy. For example, when vibrator 2 is displaced up to displacement u1, when switch 21 is opened and power generator 10 is unloaded, an area S0 below the broken line corresponds to the energy (hereinafter referred to as energy accumulated by a mechanical effect) accumulated by the mechanical displacement of vibrator 2. Comparatively, an area S1 surrounded by the broken line and the solid line and marked in cross hatch corresponds to energy (hereinafter referred to as energy accumulated by an electrical effect) accumulated electrically in the capacitor components of vibrator 2.

Figure 4:
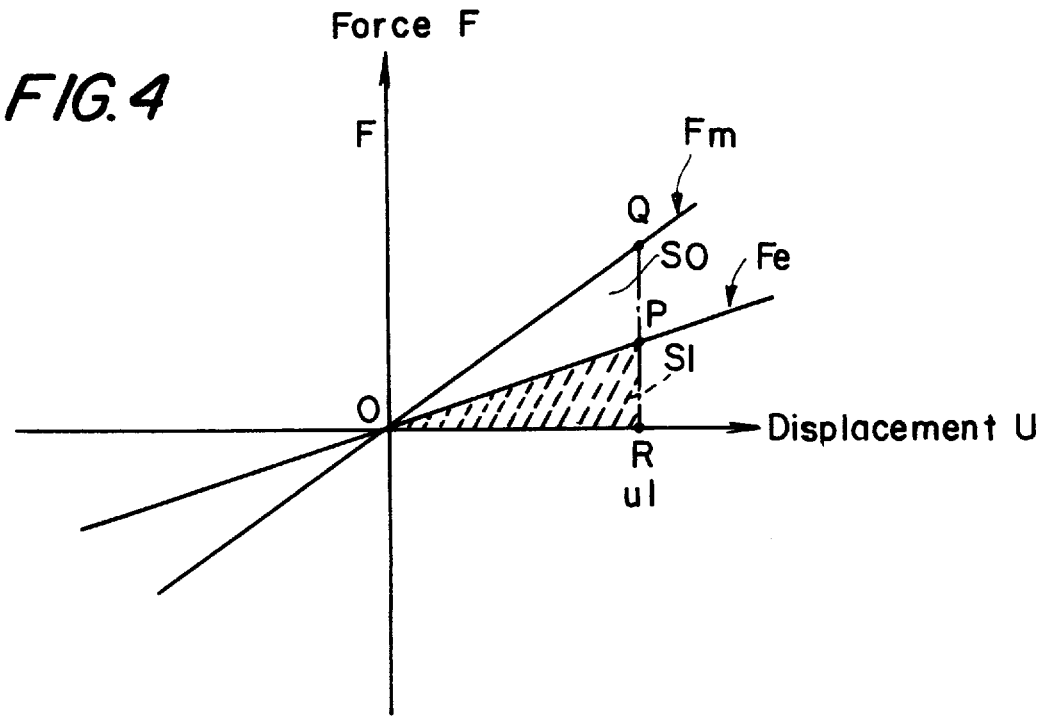
FIG. 4 is a graph depicting the relationship between the energy generated based upon a mechanical effect and an electrical effect of the power generator shown in FIG. 1.

Reference is next made to FIG. 4 in which a force Fm due to a mechanical effect is depicted as being proportional to the displacement u of vibrator 2, and a force Fe due to an electrical effect is proportional to the output voltage from power generator 10. Further, when the output voltage Vo from power generator 10 when switch 21 is open and power generator 10 is unloaded is proportional to displacement u, the relationship between the displacement of vibrator 2 when switch 21 is open and power generator 10 is unloaded and the respective forces Fm and Fe is shown in FIG. 4. More specifically, in FIG. 4, the energy accumulated by a mechanical effect corresponds to the area between force Fm and displacement u, that is, the area SO of the triangle OQP.

In both cases shown in FIGS. 3 and 4, all of the energy supplied to vibrator 2 is stored partly as energy due to a mechanical effect and energy due to an electrical effect. As shown in equation (1) below, the energy ratio at this time becomes an electro-mechanical coupling coefficient (hereinafter referred to as a coupling coefficient) K of the vibrator.

$$K^2 = S1(SO+S1) \qquad (1)$$

Figure 5:
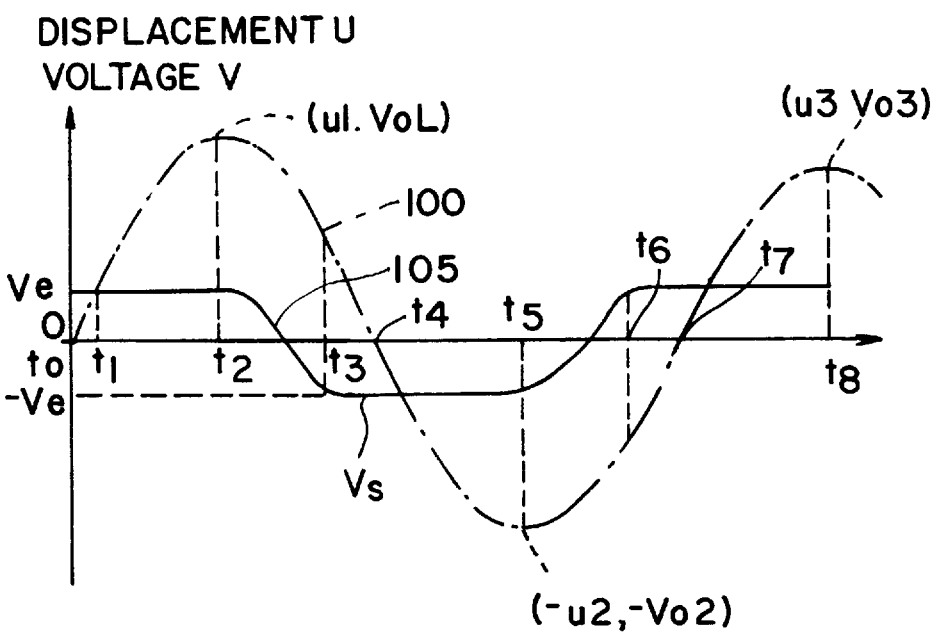
FIG. 5 is a graph depicting the relationship between changes in the displacement (u) of the vibrator and the voltage (V) of the power generated by the power generator shown in FIG. 1.

FIG. 5 depicts the displacement u of vibrator 2 when power generator 10 is electrically coupled to electric power system 20 equipped with rectifying device 23 and electric-charge storage device 25, as shown in FIG. 1. FIG. 5 shows changes in the voltage generated by power generator 10 in comparison to the displacement u, both as a function of time.

When it is considered that vibrator 2 subsequently freely vibrates after an initial displacement, the displacement u of vibrator 2 varies cyclically as indicated by the single dot-chain line 100. More specifically, vibrator 2 is cyclically displaced an amplitude u1 toward the A side (positive side) at time t2, a displacement of amplitude −u2 toward the B side (negative side) at time t5, and further a displacement of amplitude u3 toward the A side (positive side) at time t8. In the following description, the fixed values of the displacement and voltage show absolute values, and "−" is associated only with the negative side. During subsequent vibration cycles these displacements u1, u2 and u3 become gradually smaller because energy due to a mechanical effect is converted into electrical energy, thereby using up the energy of vibrator 2 and further because there occurs a mechanical loss which uses up additional stored energy. Further, since the output voltage Vo from power generator 10 when switch 21 is open and power generator 10 is unloaded is proportional to displacement U, output voltage Vo cyclically changes in a pattern similar to the cyclical pattern of the displacement u, and decreases gradually in such a way that the output voltage Vo cyclically changes to a peak value Vof at time t2, a peak value −Vo2 at time t5, and a peak value Vo3 at time t8.

Comparatively, the output voltage Vs of power generator 10 when connected to electric power system 20 and thus loaded varies as indicated by solid line 105 in FIG. 5. More specifically, when output voltage Vs reaches a voltage exceeding prescribed voltage Ve, which is the sum of forward voltage Vd of the diode bridge and the voltage Vc of capacitor 24, the charging of capacitor 24 of electric power system 20 begins. Thereafter voltage Vs is held at prescribed voltage Ve, all excess power being transferred to, and stored in capacitor 24. Therefore, voltage Vs increases corresponding to an increase in the displacement u in the period prior to time t0 which is symmetrical to the increase from time t5 to t6) and then is constant from time t0 to time t1. When output voltage Vs reaches prescribed voltage Ve at time t1, an electrical charge flows from power generator 10 through rectifying device 23 to electric-charge storage device 25, including capacitor 24. Therefore, even if displacement u increases, the voltage Vs does not increase since the excess power is being transferred to capacitor 24. For this reason, voltage Vs is kept at prescribed voltage Ve when the displacement u is greater than a predetermined amount.

When the displacement u reaches amplitude u1 at time t2 and begins to decrease thereafter, the voltage Vs also decreases with the decrease of displacement u. Therefore, voltage Vs becomes equal to or smaller than prescribed voltage Ve, and the voltage Vs once again varies with the change in the displacement u. When voltage Vs becomes negative and reaches the prescribed voltage −Ve at time t3, an electrical charge again flows to electric-charge storage device 24 through rectifying device 23. Therefore, voltage Vs is maintained at prescribed voltage −Ve and the excess charge flows to capacitor 24. When displacement u reaches the negative direction (direction B in FIG. 1), at time t4 and then reaches amplitude u2 which is a negative displacement peak at time t5 the voltage Vs is maintained at a constant −Ve. After passing time t5, the absolute value of voltage Vs begins to decrease similarly to its decrease at time t2. Therefore, since the absolute value of voltage Vs becomes equal to or smaller than prescribed voltage Ve, voltage Vs varies in conjunction with the change in the displacement u. Voltage Vs cyclically repeats these changes when displacement u also cyclically changes.

Figure 6:
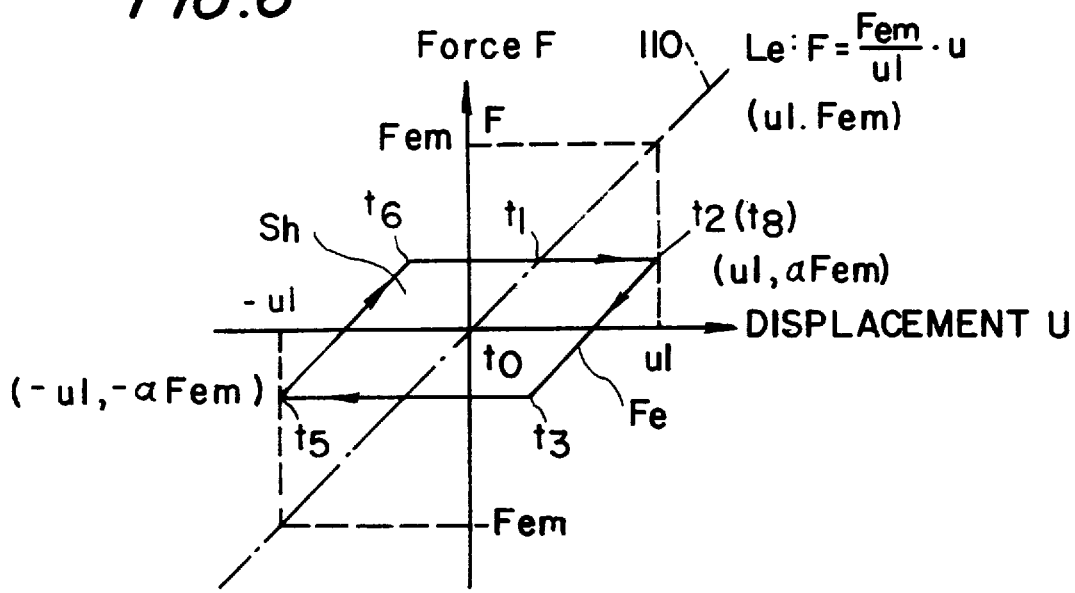
FIG. 6 is a graph depicting changes of the force (Fe) due to the electrical effect versus the displacement (u) of the vibrator of the power generator shown in FIG. 1.

FIG. 6 depicts a situation in which force Fe due to an electrical effect varies with the displacement u of vibrator 2.

The force Fe due to the electrical effect when switch 21 is opened and power generator 10 is unloaded varies linearly with respect to the displacement u in the same way as the force Fm due to the mechanical effect varies, and reaches a maximum value Fem at displacement u1 at time t2. In a similar manner, a maximum value of force −Fem in the negative direction is reached at displacement −u2 at time t5. In the following description, for the sake of simplicity, the displacement at time t5 is assumed to be −u1 and the maximum negative value of the force Fe due to the electrical effect is assumed to be −Fem. This maximum force is reached when an appropriate initial force is applied to vibrator 2 and subsequent additions of force are applied to vibrator 2 while vibrating, and therefore vibrator vibrates and resonates in a steady state. Further, FIG. 6 also shows, by the one dot-chain line 110, changes in the force Fe due to the electrical effect when switch 21 is opened, as a function of displacement u. The force due to the electrical effect Fe forms a straight line Le (110) when switch 21 is opened, as shown in FIG. 6. Therefore, no work is performed by this force. Similarly, since the force due to the mechanical effect also forms a straight line, no work performed on an external object. All of the force is retained with vibrator 2.

On the other hand, when switch 21 is opened, the output voltage Vs of power generator 10 increases in proportion to the displacement u from time t0 to time t1 (FIG. 5) in the same manner as when the force due to an electrical effect Fe is considered from t0 to t5 when switch 21 is closed. Therefore, the force Fe due to the electrical effect also increases in proportion to the displacement u. Since output voltage Vs is maintained at the prescribed voltage Ve when the output voltage Vs reaches prescribed voltage Ve of the electric power system at time t1, force Fe is also held constant.

Similarly, since output voltage Vs also decreases when the displacement u begins to decrease at time t2, force Fe due to the electrical effect also decreases. Next, when output voltage Vs reaches prescribed voltage −Ve at time t3, an electrical charge is supplied to the electric power system again, and therefore, the electrical potential Vs is held constant, all excess power generated being forwarded to capacitor 24. Therefore, during this time, force Fe due to the electrical effect is also held constant. In the period from time t2 to time t3, the state of the system is similar to that when switch 21 is opened (when power generation system 10 is unloaded, when an electrical charge is not supplied to electric power system 2 (FIG. 6)), and the change in the force Fe with respect to the displacement u becomes parallel to the straight line Le. Further, the absolute value of output voltage Vs decreases when the absolute value of displacement u begins to decrease at time t5. Therefore, an electrical charge is not supplied from power generator 10 to electric power system 20 from periods t5 to t6, and in the same way as in the period from time t2 to time t3 force Fe varies in a manner parallel to the straight line Le until the output voltage Vs reaches prescribed voltage Ve at time t6. Since an electrical charge is supplied to electric power system 20 when the output voltage Vs reaches prescribed voltage Ve at time t6, output voltage Vs is held at the prescribed voltage Ve and the excess power is provided to capacitor 24.

In the manner described above, when switch 21 is closed and a load is placed on power generator 10, force Fe due to the electrical effect varies along the hysteresis loop: time t3, time t5, and time t6. Therefore, work is performed on an external object by the force Fe due to the electrical effect, and the magnitude of this performed work is proportional to the area surrounded by the hysteresis loop. For this reason, if the area Sh surrounded by the hysteresis loop reaches a maximum at the maximum displacement u1, work will be done to an external object most efficiently when this same maximum displacement u1 is applied to vibrator 2 of the power generator 10. Thus, when the area Sh of the hysteresis loop is at a maximum, the power generation efficiency will also be at its maximum.

When switch 21 is closed and output voltage Vs is held at the prescribed voltage Ve, force Fe will be maintained at its maximum value Fem. This maximum value which is determined when switch 21 is opened and no load is applied to power generator 10 is denoted as αFem ($0 <= \alpha <= 1$). The straight line Le in FIG. 6 is defined by an equation (2) below:

$$F = \text{Fem} \times (u/u1) \quad (2)$$

In the period from time t2 to time t3, the force Fe varies parallel to equation (2), and the coordinates at time t2 become (u1, αFem). Therefore, the force Fe in the period from time t2 to time t3 is defined by the equation (3) below:

$$\text{Fe} = \text{Fem} \times (u/u1 + (\alpha - 1)) \quad (3)$$

The coordinates at time t3 can be determined to be (u1(1−2α), −αFem) by substituting Fe=−αFem in equation (3). When the coordinates of time t5 and time t6 are determined by the same method and the area Sh of the parallelogram of the hysteresis loop surrounded by each of the coordinates of time t2, time t3, time t5 and time t6 is determined, the area Sh is expressed by equation (4) below:

$$\begin{aligned} Sh &= (u1(1 - 2\alpha) - (-u1)) \times (\alpha \text{Fem} - (-\alpha \text{Fem})) \\ &= 4 \cdot \text{Fem} \cdot u1(1/4 - (\alpha - 1/2)^2) \end{aligned} \quad (4)$$

As can be seen in equation (4), the area Sh reaches a maximum when α is ½. That is, the power generation efficiency reaches a maximum when the output voltage Vs reaches the prescribed voltage Ve, i.e., when the force Fe, when switch 21 is closed (power generator 10 is loaded) and capacitor 24 is being charged, is ½ of the maximum value Fem of the force which is required when switch 21 is opened (power generator 10 is not loaded). Force Fe due to the electrical effect when switch 21 is opened is proportional to the displacement u and further proportional to voltage Ve. Therefore, the power generation efficiency of power generator 10 reaches a maximum when the prescribed voltage Ve (when switch 21 is closed and power generator 10 is loaded) is half of the peak value Vom (when switch 21 is opened and power generator 10 is not loaded).

For example, in an electric power system in which a voltage Vc of capacitor 24 of electric-charge storage device 25 is 1.5 V and a forward voltage Vd of diode 22 of rectifying device 23 is 0.5 V, the prescribed voltage Ve of power generator 10 becomes 2 V. Therefore, it can be seen that electric power can be generated most efficiently when the voltage Vom of power generator 10 using vibrator 2 is set to 4 V when switch 21 is opened and power generator 10 is loaded.

Based on the above results, in a power generation method and a power generator in which electric power is generated by using a vibrator provided with a piezoelectric element and is supplied to an electric power system, the efficiency (power generation efficiency, charging efficiency or power feeding efficiency) at which electric power is supplied from the power generator to the electric power system can be maximized when the output voltage Vom (unloaded voltage i.e., when no load is connected to the power generator) is twice as great as the prescribed voltage Ve of the power generator of the electric power system. Since the open voltage Vom is proportional to the displacement u, the power generation efficiency can be maximized by applying to the vibrator the displacement u such that the unloaded voltage Vom is twice as great as the prescribed voltage Ve. Therefore, in order to provide a power generator having high power generation efficiency, it is preferable that the vibrator be continuously and repeatedly vibrated at a displacement u at which the unloaded voltage Vom is as close as possible to twice as great as prescribed voltage Ve. For example, in a power generator capable of continuously vibrating at a constant displacement u (e.g., amplitude) while applying a displacement to the vibrator which decreases due to power generation or mechanical loss, if an appropriate amount of additional displacement is applied to the vibrator, it is possible to supply electric power at a high efficiency by causing the vibrator to vibrate at a constant displacement u (steady state) at which unloaded voltage Vom is approximately two times as great as prescribed voltage Ve.

An example of an apparatus capable of causing a vibrator to vibrate at a substantially steady, repeatable displacement will now be described. In such a power generator, vibration of the vibrator at a displacement u at which the unloaded voltage Vom is approximately twice as great as prescribed voltage Ve makes it possible to supply electric power at high efficiency from the power generator. However, it is not necessarily possible to steadily supply energy to a mechanism for applying a displacement to a vibrator. In particular, energy which is input to the power generator and converted into electrical energy may not be stable, consistent energy. In such cases where the energy to be supplied to the power generator to generate electric power is not very stable, it is still important to apply a displacement u such that the open voltage Vom is approximately twice as great as prescribed voltage Ve, as noted above. This displacement must be consistently applied over a period of time during which electric power is generated so that electric power is generated at a high efficiency.

In particular, in a method for generating power and a power generator in which an initial displacement is repeatedly applied to a piezoelectric element by applying a displacement to a piezoelectric element from an external source, such as by impact or flexing, or applying a displacement to a piezoelectric element by a vibrator which spontaneously applies a displacement to itself due to the weight or the mass of the piezoelectric element itself. Electric power is generated when the vibrator is given a fixed displacement in a resonance state rather than when the vibrator is given an initial displacement and then allowed to freely vibrate, as will be described below. It is important to apply a proper force to the vibrator to generate a consistent displacement such that unloaded voltage Vom is approximately twice as great as prescribed voltage Ve in order to increase the power generation efficiency and increase the overall amount of power generated.

On the other hand, in a power generator in which an initial displacement is applied to a vibrator to cause the vibrator to subsequently vibrate freely can be more easily constructed than a mechanism in which a vibrator is steadily vibrated, as discussed above. Furthermore, in a mechanism in which a piezoelectric element subsequently vibrates freely after application of an initial displacement, it is also possible to increase the conversion efficiency from kinetic energy to electricity by converting the kinetic energy generated in each subsequent free vibration after the initial displacement into electrical energy. When electric power is generated by also using the kinetic energy of the subsequent free vibrations, the amplitude of these subsequent free vibrations decrease an amount equal to the amount of energy converted into electrical energy, and the loss of mechanical energy. Therefore, in a power generation method and power generator using vibrations of a piezoelectric element which generates power from the initial and subsequent free vibrations, it is preferable that the condition noted above which gives the maximum efficiency be always met. Thus, the initial value (the initial electromotive voltage) of the unloaded voltage due to the initial displacement should still be set at twice as great as prescribed voltage Ve. It is possible to use apparatuses which generate an initial displacement by an external excitation source, such as impact or flexing, or by a self-excitation, internal source, which uses the weight or the mass of the piezoelectric element itself to generate the initial displacement, and the subsequent free vibrations.

Referring once again to FIG. 5, when the open voltage Vo1 at a peak at time t2 is twice as great as the prescribed voltage Ve, the power generation efficiency is maximized. However, since some of the energy accumulated due to the mechanical effect of the piezoelectric element is converted into electrical energy at a rate determined by the coupling coefficient K and some of the mechanical energy accumulated is lost through mechanical loss, the peak value of the displacement u decreases gradually during subsequent free vibrations. Therefore, since the amplitude of the vibration of vibrator 2, which vibrates freely after an initial displacement is applied, decreases gradually, the unloaded voltage (the initial value of the voltage when switch 21 is opened, the initial electromotive voltage) Vo1 due to the initial displacement must be set higher than twice the prescribed voltage Ve so that electric power is actually generated most efficiently. On the other hand, too high an initial displacement Vo1 (initial electromotive voltage) is undesirable since the power generation efficiency per period is poor and a large mechanical loss of energy occurs.

When the mechanical energy, electrical energy, and losses as a result thereof, are analyzed every half cycle, the following results are seen. First, a typical value of a half cycle of energy Um1 accumulated due to the mechanical effect, in a period from time t0 to time t4, can be expressed as shown below by using the coupling coefficient K, the electrostatic capacity C and the peak value Vo1 at time t2:

$$Um1 = 1/K^2 \times \tfrac{1}{2} \cdot C \cdot Vo1^2 \qquad (5)$$

The energy Wc lost due to the mechanical loss of the power generator in this period of a half cycle can be expressed by the following equation when the loss ratio is denoted as Lc:

$$Wc1 = Um1 \times Lc \qquad (6)$$

The amount of electrical charge Q1 supplied to the electric power system in this half cycle can be expressed as follows:

$$Q1 = 2 \cdot C \times (Vo1 - 2 \cdot Ve) \qquad (7)$$

where the prescribed voltage Ve is the sum of the charged voltage Vc of the capacitor and the forward voltage Vd of the diode.

The work Wq1 done by the electrical charge Q1 to the electric power system, that is, the diode and the capacitor, can be expressed by the following equation:

$$Wq1 = Q1 \times Ve \qquad (8)$$

Therefore, the total decrease of the energy Um1 accumulated due to the mechanical effect in this half cycle is the sum of the Wc1 due to the mechanical loss and the work Wq1 done by the electrical charge Q1 supplied to the electric power system. Therefore, energy Um2 to be accumulated due to the mechanical effect of the next half cycle (from time t4 to time t7) can be expressed by the following equation:

$$Um2 = Um1 - Wc1 - Wq1 \qquad (9)$$

Thus, the energy due to the mechanical effect, the loss thereof, and the energy due to the electrical effect can be calculated every half cycle. Therefore, it is possible to determine overall the amount of power generated from an initial displacement and the subsequent free vibrations generated therefrom, and the efficiency of power generation by determining each energy level for each period similarly to that described above until the voltage Voi of the i-th cycle during open time becomes equal to or smaller than the prescribed voltage Ve. By accumulating the energy for each of these periods, it is possible to determine the total energy generated.

Figure 7:
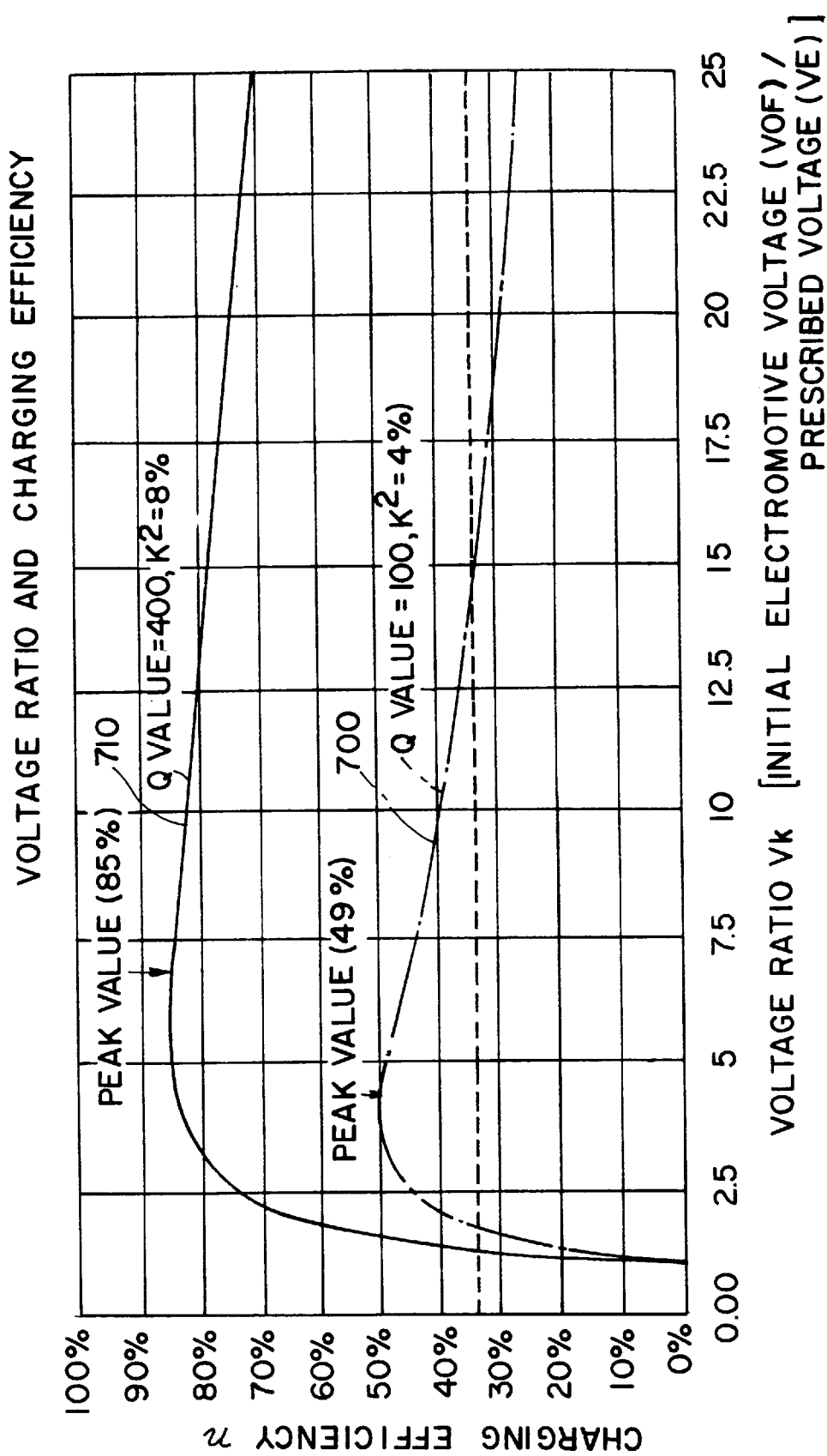
FIG. 7 is a graph depicting changes in the charging efficiency p of the power generator shown in FIG. 1 as a function of the voltage ratio (Vk) of the initial electromotive voltage (Vof) of the unloaded voltage of the power generator shown in FIG. 1 to the prescribed voltage (Ve) of the power generator shown in FIG. 1.

FIG. 7 depicts the charging efficiency as a function of voltage ratio. The charged voltage Vc of the capacitor is 1.5 V, the forward voltage Vd of the diode is 0.5 V. The charging efficiency n at which power generator 10 is charged using a piezoelectric element is shown as a function of the ratio Vk (Vof/Ve) of the initial electromotive voltage Vof to the prescribed voltage Ve where the prescribed voltage Ve is 2 volts. The change in the charging efficiency n by power generator 10 having a coupling coefficient $K^2$ of 4% when the Q value of the vibrator having piezoelectric elements laminated therein is 100 (the loss percentage Lc is approximately 0.06) is indicated by the single-dot-chain line 700. The change of the charging efficiency n by power generator 10 having a coupling coefficient $K^2$ of 8% when the Q value of the vibrator having piezoelectric elements laminated therein is 400 (the loss percentage Lc is approximately 0.015) is indicated by solid line 710.

It can be seen from changes of the charging efficiency n in FIG. 7 that the highest charging efficiency n can be obtained when the voltage ratio Vk of the initial electromotive voltage Vof to the prescribed voltage Ve is from 4 to 6. It can also be seen from the graph of FIG. 7 that the range where the highest charging efficiency can be obtained is only slightly related to the coupling coefficient K and the mechanical loss percentage Lc, but rather depends largely on the voltage ratio Vk.

Figure 8:
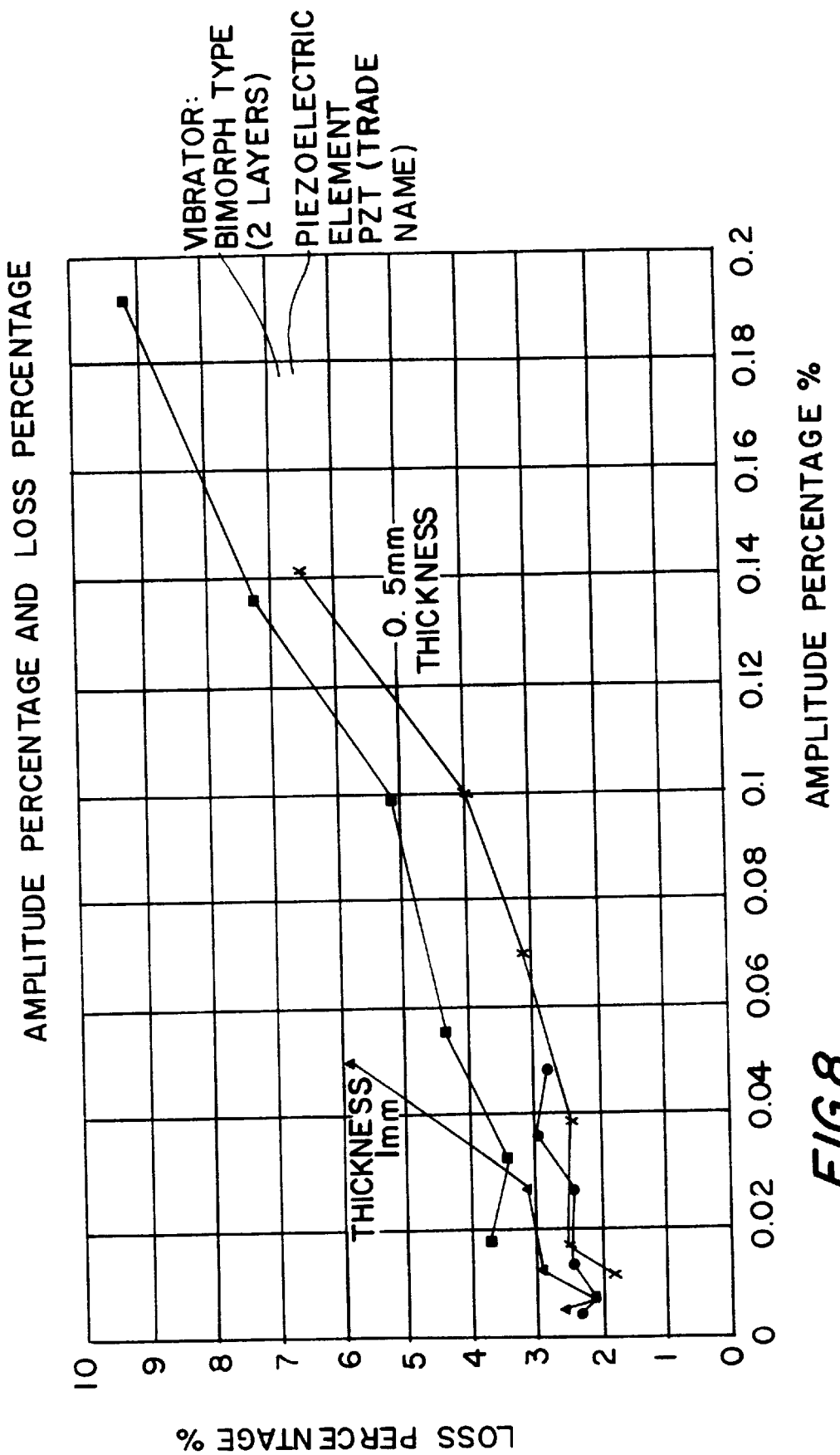
FIG. 8 is a graph depicting changes of the mechanical loss percentage of the power generator shown in FIG. 1 as a function of the amplitude percentage of the initial displacement.

It can be further seen that it is possible to charge at a charging efficiency n of approximately 70% or more of the peak value in any case when the voltage ratio Vk is from 2 to 15. Also, even if the voltage ratio Vk is 15 or more, it can be seen that a sufficiently high charging efficiency n can be obtained in a number of power generators. In particular, in a power generator having a high coupling coefficient and a high Q value, a voltage ratio Vk of greater than 15 can be used. However, since the output voltage when the switch is open and no load is applied to the power generator is proportional to the amplitude of the vibration of the vibrator, this amplitude percentage is 20 or more times as great when the voltage ratio Vk surpasses 20. This results in a greater mechanical loss, as is shown in FIG. 8, which depicts the measured values of the mechanical loss percentage Lc as a function of the amplitude percentage. For example, when the amplitude ratio shown in FIG. 8 is 0.2 the loss ratio becomes approximately 5 times as great as when the amplitude ratio is only 0.01. Since, the displacement which is initially applied to the vibrator is large when the amplitude ratio increases, the mechanical load increases, and failures are liable to occur. Therefore, the voltage ratio Vk is preferably set to a value of approximately 20 or less.

When electric power is generated by applying an initial displacement in a power generation method and a power generator using a piezoelectric element which is either externally excited or self-excited and which subsequently freely vibrates, the initial displacement is not always generated by a consistent amount of energy. In particular, in a power generator and a power generation method for use in portable electronic devices which use ambient energy or the motion of a user as an energy source, the supplied energy utilized for generating electric power is not uniform. In order to generate electric power by using such non-uniform energy, it is still important to apply an initial displacement such that the initial electromotive voltage Vof is 2 to 20 times as great as the prescribed voltage Ve to the piezoelectric element continuously and consistently to generate electric power from the initial displacement and the free vibrations caused thereafter in order to efficiently generate power. Additionally, it is more preferable to apply an initial displacement such that the initial electromotive voltage Vof is 2 to 15 times as great as the prescribed voltage Ve in order to further improve the efficiency of power generation. It is still more preferable to provide a consistent initial displacement such that the initial electromotive voltage Vof is 4 to 6 times as great as the prescribed voltage Ve in order to further improve the efficiency of power generation.

Figure 9:
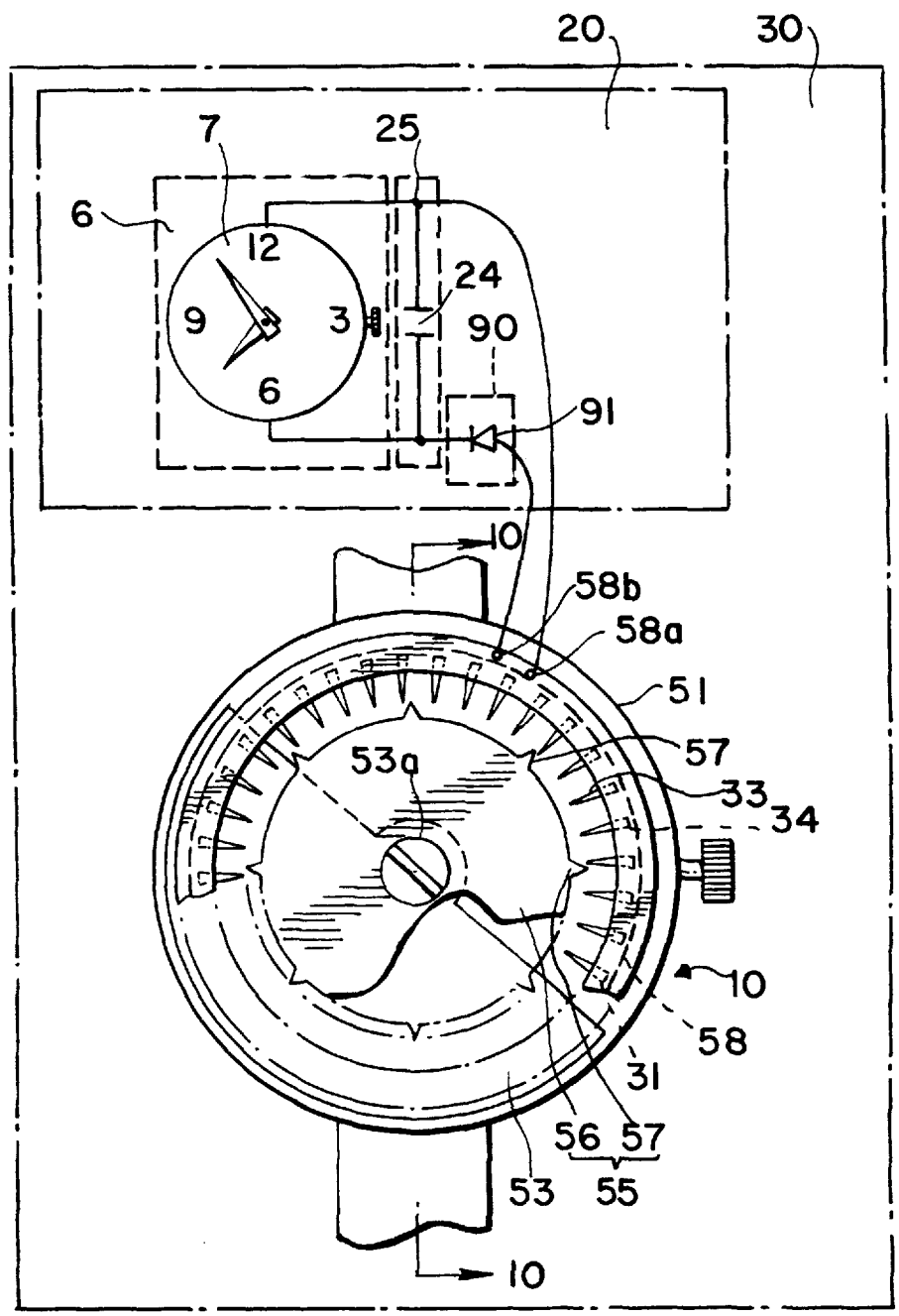
FIG. 9 is a schematic drawing depicting an example of a wrist watch provided with a power generator to which a fixed initial displacement can be applied in accordance with the invention.
Figure 10:
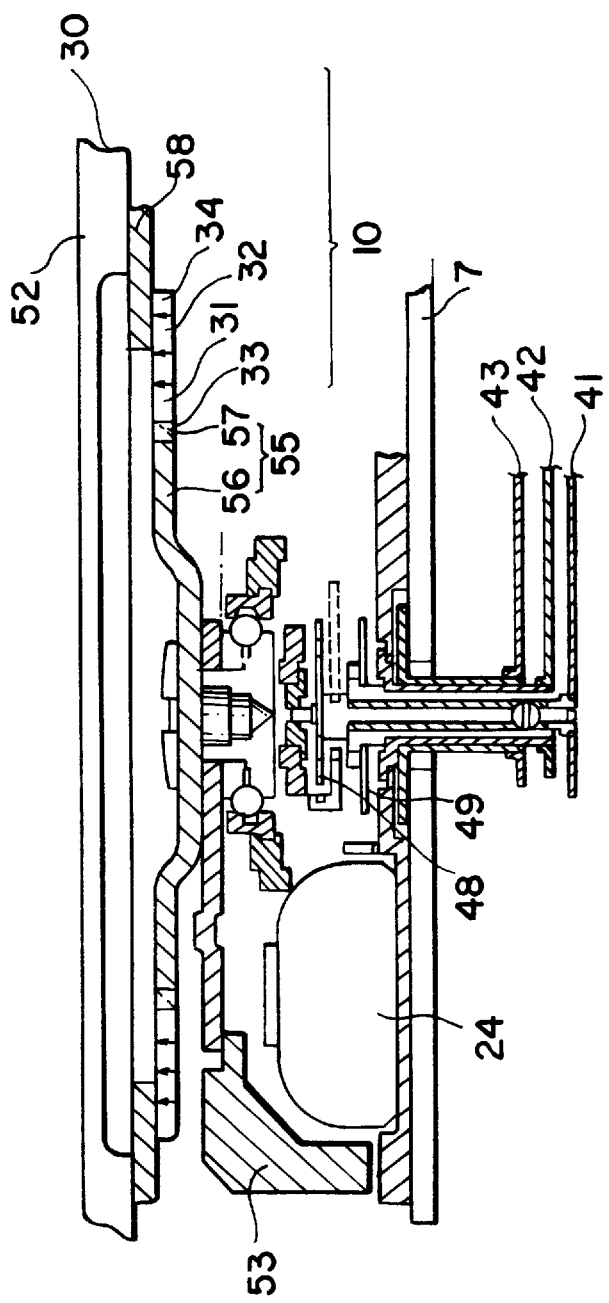
FIG. 10 is a cross-sectional view taken along line 10—10 of FIG. 9.

A further embodiment of the present invention will now be described with reference to FIG. 9. FIG. 9 depicts a wrist watch 30 as an example of a portable electronic device provided with a power generator constructed in accordance with the invention. FIG. 10 is an enlarged sectional view of the power generator portion of wrist watch 30 taken along line 10—10 of FIG. 9. Wrist watch 30 of this embodiment includes a thin case 51 which is formed into a substantially circular shape and is adapted to be attached to the wrist of a user. Housed in case 51 are power generator 10, using a piezoelectric element, and electric power system 20 which receives a supply of electric power from power generator 10. Case 51 of wrist watch 30 of this embodiment, as is shown in FIG. 10, includes a rear case 52, one surface of which is maintained in contact with the wrist of a user, a character plate display section 7 of timer device 6, and a transparent cover (not shown) which covers display section 7. Various additional apparatuses associated with time keeping are disposed in the space between rear case 52 and the display section 7. A semiconductor substrate 58 having a rectifying function is mounted on rear case 52. An electric-charge storage circuit 25 includes a large-capacity capacitor 24 for accumulating rectified electric power mounted on display section 7.

Power generator 10 is provided with a plurality of vibration arms 31 formed of piezoelectric elements about substrate 58 facing inwardly therefor. A drive system such as a rotation weight 53 for supplying energy to these vibration arms 31 is rotably mounted within case 52. Power generator 10 also includes large-sized capacitor 24 which forms an electric-charge storage circuit, and a fourth wheel 48 and second wheel 49 for operating a second hand 41, a minute hand 42 and a hour hand 43, which are the components which function as an electronic clock.

Rotation weight 53 is disposed so as to rotate relative to the center of case 51 about rotation center 53a as a result of the motion or the like of the wrist of the user. A rotation member 56 is fixed to rotate together with rotation weight 53. A plurality of projections 57 which project outwards from rotation member 56 are formed on the outer peripheral portion of rotation member 56, and a plurality of tips 33 of the plurality of vibration arms 31 arranged radially in the case 51 around the periphery of rotation member 56 are selectively brought into contact with projections 57 of rotation member 56.

Substrate 58 is a thin doughnut-shaped semiconductor disposed in such a manner as to surround the plurality of vibration arms 31. A base end (support end) 34 of each vibration arm 31 on an end of vibration arm 31 opposite tip 33 is mounted on semiconductor substrate 58. Therefore, in power generator 10 of this embodiment, when rotation weight 53 rotates, rotation member 56 and projections 57 perform the function of a displacement application apparatus (vibration application apparatus) 55 and apply an initial displacement to each of vibration arms 31, causing subsequent free vibrations to be thereafter generated. Electric power generated in a piezoelectric layer 32 of each vibration arm 31 due to these subsequent free vibrations is supplied to electric power system 20 the semiconductor substrate 58 which acts as a power transfer unit.

Further, a processing unit 6 is provided which is operated by the rectified electric power and is electrically coupled to electric-charge storage circuit 25. Processing unit 6 of this embodiment displays the time continuously without batteries, and is powered by the electric power from power generator 10. Additionally, in this embodiment, a reverse current prevention section 90 is provided so as to prevent current from leaking in the reverse direction flowing from electric-charge storage device 25 into power generator 10 or one of the plurality of vibration arms 31.

A more detailed description of the operation of the embodiment depicted in FIGS. 9 and 10 will now be given. In wrist watch 30 of this embodiment, as shown in FIGS. 9 and 10, rotation weight 53, which becomes unbalanced due to movement because it is a heavy weight and is situated around the outer periphery of power generator 10, is disposed in such a manner as to surround a mechanism, such as a timer device, housed in case 51. For this reason, when the acceleration applied to wrist watch 30 varies due to the varied motion or the like of the wrist of the user, rotation weight 53 rotates about rotation center 53a. This motion of the user or the like can thus be captured as rotational energy of rotation weight 53. Therefore, when rotation weight 53 rotates, rotation member 56 mounted adjacent rear case 52 rotates together with rotation weight 53, and each of the plurality of projections 57 provided on the outer peripheral portion of rotation member 56 come into contact with each tip 33 of each vibration arm 31. When rotation member 56 further rotates, after a predetermined displacement (initial displacement) is applied to the tips 33 of the vibration arms 31, projections 57 disengage from vibration arms 31 and the vibration arms 31 start vibrating. Therefore, in each vibration arm 31, subsequent free vibrations of a predetermined amplitude are excited within tips 33. Since each vibration arm 31 of this embodiment is formed of piezoelectric layer 32 of PZT or the like, when a displacement of vibration arm 31 occurs in piezoelectric layer 32 due to vibration, an electromotive force occurs and electric power is generated. Electric power generated by each vibration arm 31 is collected in output electrodes 58a and 58b through wiring formed on the semiconductor substrate 58 and is output to electric power system 20 from these output electrodes 58a and 58b so as to charge capacitor 24 and to operate timer device 6.

Figure 11:
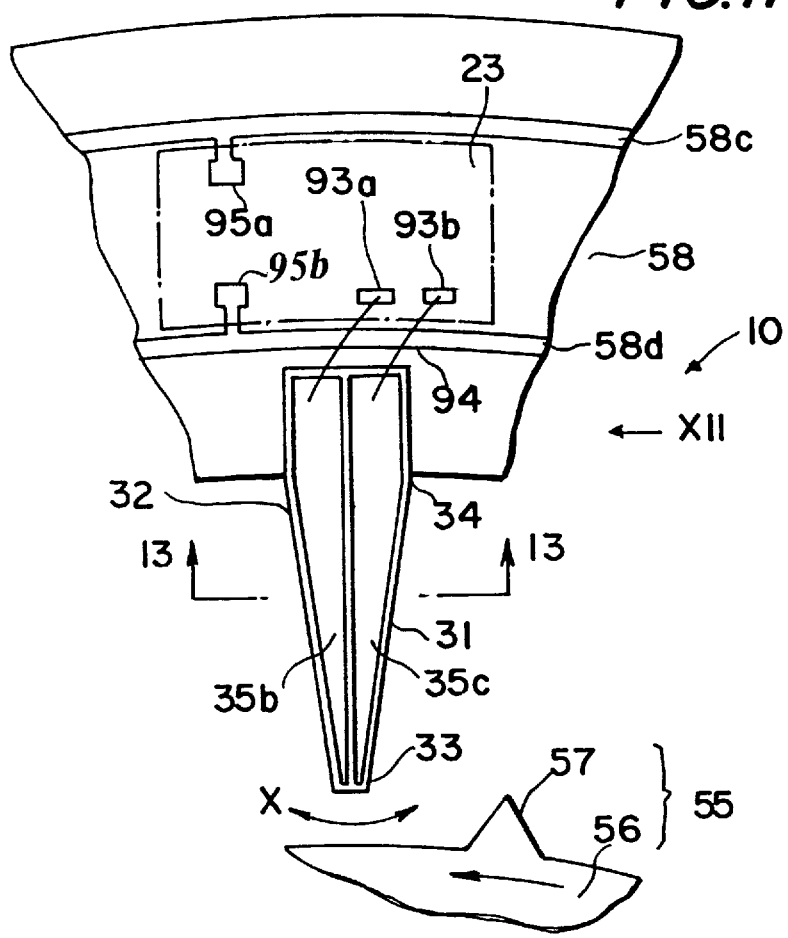
FIG. 11 is an enlarged top plan view of a vibration arm shown in FIG. 9.
Figure 12:
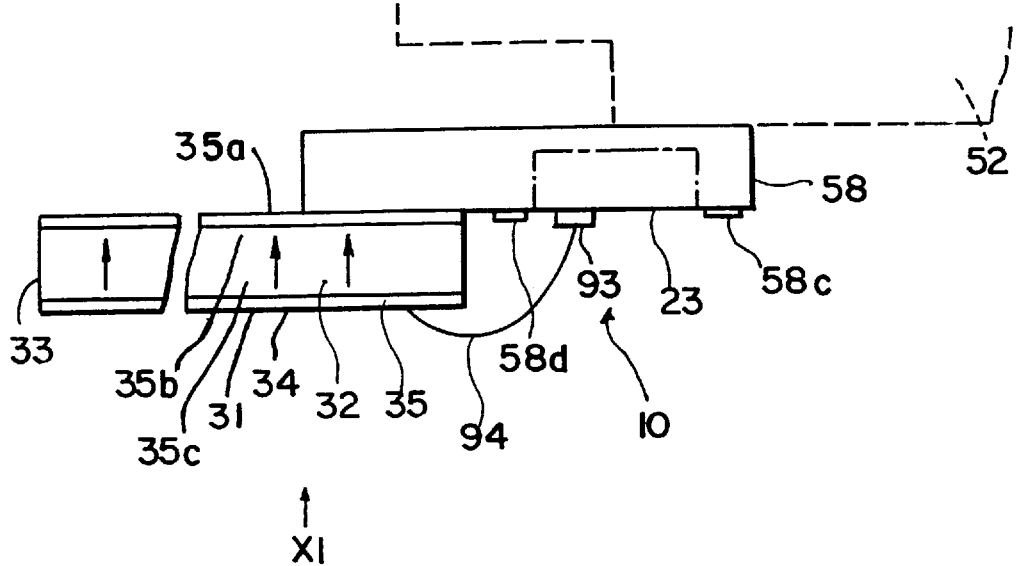
FIG. 12 is a side elevational view of the vibration arm shown in FIG. 11.
Figure 13:
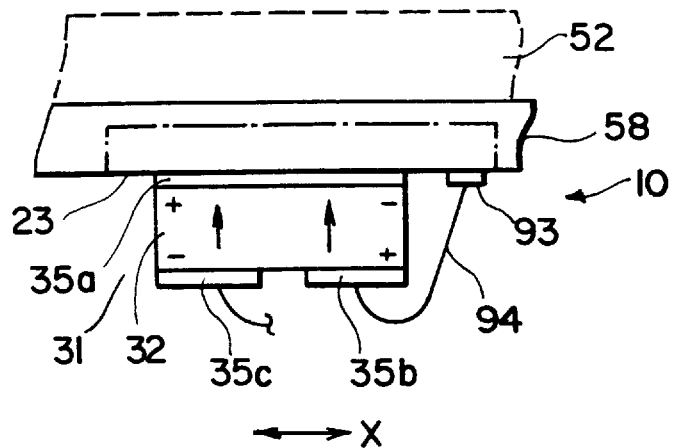
FIG. 13 is a cross-sectional view taken along line 13—13 of FIG. 11.

Reference is next made to FIGS. 11, 12 and 13, which depict enlarged views of one vibration arm 31 from among the plurality of vibration arms provided in power generator 10 of this embodiment. FIG. 11 shows a bottom plan view of vibration arm 31 mounted in the semiconductor substrate 58. FIG. 12 shows a side elevational view of vibration arm 31. FIG. 13 shows cross-sectional view of vibration arm 31 taken along line 13—13 of FIG. 11. Vibration arm 31 of this embodiment is formed of a thin piezoelectric layer 32 made of PZT which is polarized in the up and down direction in the figure as shown in FIGS. 12 and 13. Vibration arm 31 is a plate-like vibration arm whose width becomes narrower from support end (base end) 34 fixed to semiconductor substrate 58 toward tip 33 which vibrates freely. Electrodes 35a, 35b, and 35c are laminated on the upper and lower surfaces of vibration arm 31. When projections 57 of rotation member 56 are moved in the direction of arrow Y (FIG. 11), vibration arm 31 of this embodiment is released after tip 33 of vibration arm is forcibly bent or flexed by a predetermined amount in the right-and-left direction indicated by double headed arrow X in FIG. 11. Therefore, subsequent free vibrations in either direction of arrow X are excited in vibration arm 31, causing an electromotive force in a direction opposite to the direction of displacement of vibration arm 31 and in the direction of displacement to occur on the upper and lower surfaces of piezoelectric layer 32. In vibration arm 31 of this embodiment, electrode 35a is provided on a first entire surface 31a of vibration arm 31, and two electrodes 35b and 35c are provided on second surface 31b on the side of vibration arm 31 opposite electrode 35a in such a manner as to divide the second surface 31b of vibration arm 31 into right and left sides and to connect these sides in series. Therefore, by connecting the electrodes 35b and 35c of vibration arm 31 to rectifying section 23 provided on semiconductor substrate 58, the electromotive force generated in each of the right and left sides of the vibration arm 31 can be transferred out as electric power in a series-connected state.

As described above, power generator 10 of this embodiment is designed to be able to apply an initial displacement of a predetermined amount to vibration arm 31 by projections 57 of rotation member 56. Therefore, it is possible to position and arrange projections 57 of rotation member 56 and tips 33 of vibration arms 31 in such a way that the voltage when power generator is unloaded (the initial electromotive voltage) Vof generated in piezoelectric layer 32 of vibration arm 31 due to the initial displacement is 2 to 20 times as great as the prescribed voltage Ve of the electric power system 20. The prescribed voltage Ve is the sum of the prescribed charged voltage Vc of the large-capacity capacitor 24 and the forward voltage Vd of the diode 22 of the rectifying device 23. The initial electromotive voltage Vof is more preferably, 2 to 15 times as great as the prescribed voltage Ve, and is most preferably 4 to 6 times as great as the prescribed voltage Ve. Further, it is possible to supply electric power to electric power system 20 efficiently from the power generator 10. If the electromotive voltage Vof is set as described above with respect to the prescribed voltage Ve. Therefore, it is possible to operate wrist watch 30 and the processing unit 6 having a timer function at anytime and at anyplace without batteries by utilizing kinetic energy obtained from the motion of the user or the like and efficiently converting this kinetic energy into electrical energy.

A more detailed description of the embodiment depicted in FIGS. 11, 12, 13 will now be given. In semiconductor substrate 58 of this embodiment, the rectifying device 23 is formed in the vicinity of the support end 34 of each vibration arm 31 by a PN junction formed by known technology for manufacturing integrated circuit boards, such as photolithography technology or diffusion technology. Input terminals 93a and 93b of rectifying device 23 are electrically coupled by wire bonding 94 to electrodes 35b and 35c of vibration arm 31, respectively. The alternate current generated in each vibration arm 31 is rectified by rectifying device 23, and the resulting direct current can be supplied from output terminals 95a and 95b to two power lines 58c and 58d, respectively, which are formed on semiconductor substrate 58 of this embodiment in order to collect DC power rectified by each rectifying device 23. Therefore, the electric power of individual vibration arms 31 rectified by the plurality of rectifying devices 23 can be collected by output electrodes 58a and 58b and supplied to electric charge storage device 25 by these two power lines 58c and 58d.

Figure 14:
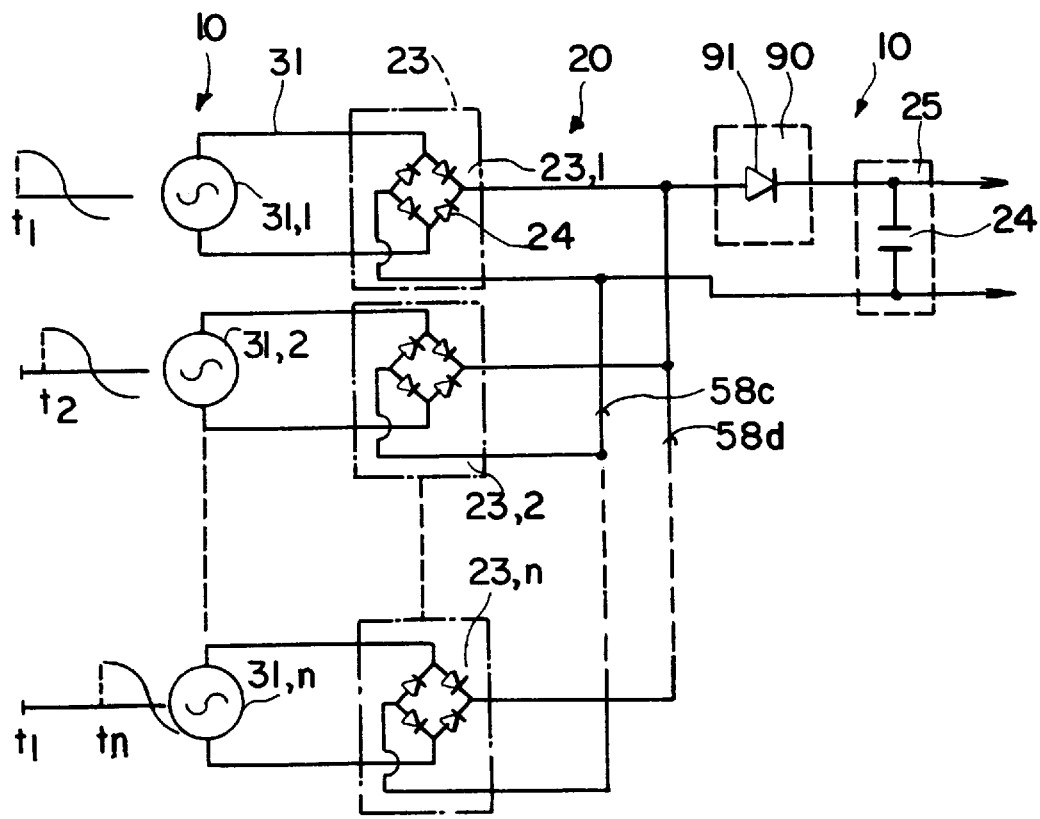
FIG. 14 is a circuit diagram of the electric power system of the wrist watch shown in FIG. 9.

FIG. 14 schematically depicts the circuitry of power generator 10 and electric power system 20 of this embodiment. As described above, in power generator 10 of this embodiment, a plurality of vibration arms 31,1 to 31,n are disposed radially around the periphery of rotation member 56. Because of this arrangement, rotation member 56 rotates as rotation weight 53 rotates, and a displacement of a predetermined magnitude is applied in sequence to each of vibration arms 31,1 to 31,n by projections 57 of rotation member 56. This causes a vibration of a predetermined magnitude to be excited in each of vibration arms 31,1 to 31,n. These vibrations cause the respective vibration arms 31,1 to 31,n to output alternating current as discussed above. Since rectifying devices 23,1 to 23,n are provided coupled with respective vibration arms 31,1 to 31,n, the alternating current is rectified into DC power and thereafter is output to the power lines 58c and 58d. Therefore, in power generator 10 of this embodiment, it is possible to continuously input the kinetic energy of rotation weight 53 to power generator 10, and the kinetic energy of rotation weight 53 can be utilized for efficient power generation.

While it is possible to provide an apparatus which generates electric power by applying a predetermined displacement to a single vibration arm 31 by rotation member 56, in such a power generator, since vibration is intermittently excited only in a single vibration arm 31 by the motion of rotation weight 53, only a very small part of the kinetic energy of the rotation weight 53 can be utilized for power generation. In contrast to this, in power generator 10 of the invention, a displacement is applied to the plurality of vibration arms 31,1 to 31,n one after another. Therefore, the kinetic energy of rotation weight 53 can be converted into electrical energy efficiently by the plurality of vibration arms 31,1 to 31,n.

Figure 15A:
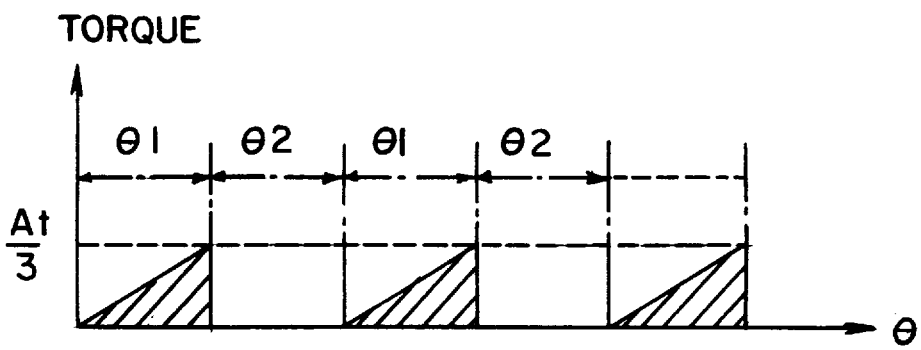
FIG. 15A is a graphical representation depicting a model in which the kinetic energy of a rotation weight is supplied to a single vibration arm in the power generator of the invention.
Figure 15B:
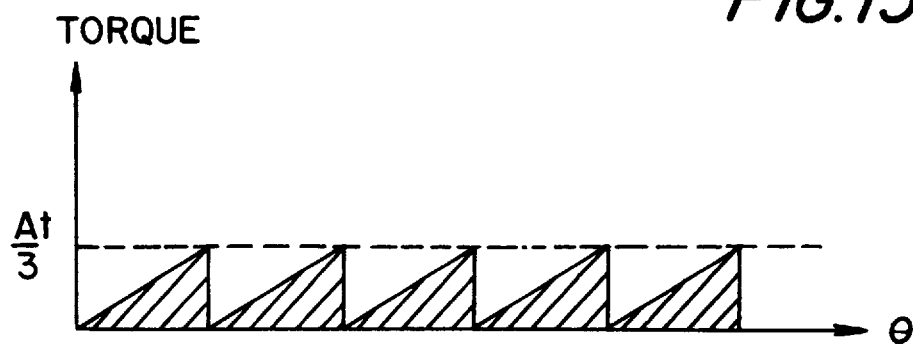
FIG. 15B is a graphical representation depicting a model in which kinetic energy of a rotation weight is supplied to a plurality of vibration arms in the power generator of the invention.
Figure 15C:
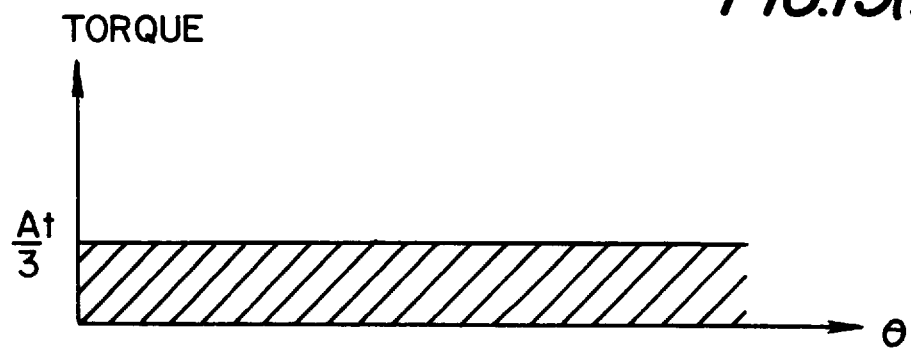
FIG. 15C is a graphical representation depicting a model in which the kinetic energy of a rotation weight is continuously supplied to a plurality of vibration arms in the power generator of the invention.

Referring next to FIGS. 15A, 15B and 15C, the efficient use of the kinetic energy of rotation weight 53 in the electric power system 20 of the invention will now be described. FIG. 15A shows energy obtained when a single vibration arm 31, utilized in the power generator of the above-described comparative example, is vibrated as a result of the motion of rotation weight 53, thereby generating electric power. When all the torque that the rotation weight 53 generates is denoted as At (N·m), a part of all the torque, T, e.g., approximately ⅓ At, is converted to vibration arm 31 to initially displace vibration arm 31. When all the torque At generated by rotation weight 53 becomes necessary to displace the vibration arm, i.e. T=At, the motion of the rotation weight is stopped. Also, if torque T required for displacement of the vibration arm is too large, since the rotation weight will be too small to move the arm, it becomes impossible to efficiently obtain kinetic energy from the motion of the user or the like. Therefore, it is preferable that torque T required to displace a single vibration arm be set at approximately ⅓ of all the torque At (T=At/3).

In order to cause the vibration arm to vibrate to generate electric power, a first period of time during which a displacement is applied to the vibration arm and a second period of time during which electric power is generated due to subsequent free vibration of the vibration arms are required. Since these times are proportional to the rotational angle of the rotation weight, the above times are shown respectively by rotational angles $\theta_1$ and $\theta_2$ in FIG. 15A. In order to increase the amount of power generation by one vibration arm, it would be preferable that the angle $\theta_2$ at which electric power is generated be set to be as great as possible. However, if angle $\theta_2$ at which subsequent free vibrations are made to occur is made too large, $\theta_1$ will be too small, and the probability that kinetic energy will be transferred from the rotation weight to the vibration arm decreases, and therefore, the energy of the rotation weight cannot be efficiently transferred to the vibration arm. For this reason, a power generator (FIG. 15A) is proposed in which angle $\theta_1$ required to apply a displacement to the vibration arm is equal to angle $\theta_2$ at which electric power is generated by subsequent free vibrations. In such a power generator, energy e input from the rotation weight to the vibration arm by one impact is as follows:

$$e = \tfrac{1}{2} \times At/3 \times \theta_1 \qquad (10)$$

Also, the number of times that energy can be input to the vibration arm while the rotation weight rotates 180° ($\pi$) is as follows:

$$n = \pi/(\theta_1+\theta_2) = \pi/(2\theta_1) \qquad (11)$$

Therefore, energy E1 which can be input to the vibration arm while the rotation weight rotates $\pi$ is as follows:

$$E_1 = e \times n = \pi \cdot At/12 \qquad (12)$$

Comparatively, energy $E_2$ which can be obtained while the rotation weight rotates $\pi$ is as follows:

$$E_2 = \int At \cdot \sin\theta \, d\theta \, (\theta=0 \text{ to } \pi=2At) \qquad (13)$$

Therefore, of the kinetic energy $E_2$ obtained by the rotation weight, the ratio (energy transmission efficiency n) of the energy $E_1$ which can be input to the vibration arm is as follows:

$$\zeta = E_1/E_2 = 0.13 \qquad (14)$$

As described above, in a model utilizing a single vibration arm shown as a comparative example, only approximately 13% of the kinetic energy obtained by the rotation weight is input to the vibration arm. Therefore, the rotation weight continues to rotate or pivot by the remaining kinetic energy and transmits the kinetic energy to the same vibration arm. As a result, it takes an extremely long time to transmit all of the kinetic energy of the rotation weight to the vibration arm, and most of the kinetic energy of the rotation weight is lost as a mechanical energy loss during that time. Further, the continuous motion of the user, such as the motion of the arm, is an energy source which is transferred to the rotation weight. However, if it takes time to transmit the energy from the rotation weight to the vibration arm, there is a high probability that another movement by the user will contradict the motion of the rotation weight. This may cause the rotation weight to stop its motion and the kinetic energy obtained by the rotation weight cannot be used for power generation. Rather, the kinetic energy will be canceled out, and no energy will be transferred to the rotation arm. Therefore, in order to effectively utilize the kinetic energy of the rotation weight for power generation, it is preferable that the energy be transmitted in a short period of time.

On the other hand, in order to effectively convert the input energy obtained by the vibration arm into electrical energy, it is preferable that the period during which subsequent free vibrations are made be extended to a certain degree. For this reason, the angle $\theta_2$ at which free vibrations can be made is often greater than the angle $\theta_1$ during which a displacement is applied to the vibration arm. Therefore, in a model using a single vibration arm, if the time during which kinetic energy is transmitted from the rotation weight to the vibration arm is shortened in order to increase the time during which free vibrations can occur, the charging efficiency in the vibration arm is decreased as noted above. Therefore, the total energy transmission efficiency n tends to decrease even further.

Comparatively, in the power generator of this invention, shown in FIG. 14, when applying an initial displacement in sequence to a plurality of vibration arms, the number of times that the rotation weight can input energy to the vibration arm can be increased to a greater extent without shortening the period during which the vibration arm converts input energy into electrical energy, and the energy transmission time from the rotation weight to the vibration arm can be shortened. For example, in a model in which an initial displacement is applied to the plurality of vibration arms as shown in FIG. 15B, energy which can be input to the vibration arms provided in the power generator becomes twice as great as that described above in FIG. 15A. As a result, the energy transmission efficiency n increases to approximately 26%. Further, since the time during which electric power is generated by free vibrations can be set to be long in each individual vibration arm, it is possible to effectively convert input kinetic energy into electrical energy.

Furthermore, as shown in FIG. 9, when a plurality of projections 57 are provided in rotation member 56 which is fixed thereto, and therefore moves in conjunction with rotation weight 53, and the plurality of vibration arms 31 are vibrated by these projections 57, as shown in FIG. 15C, it is possible to input the kinetic energy of the rotation weight nearly continuously to vibration arms 31 provided in the power generator. In such a case, energy $E_1$, which can be obtained by the total vibration arms provided in the power generator while the rotation weight rotates π is as follows:

$$E'_1 = At/3 \times \pi \quad (15)$$

Therefore, the energy transmission efficiency ζ becomes:

$$\zeta = E'_1/E_2 = 0.52 \quad (16)$$

Thus, nearly half of the kinetic energy obtained by the rotation weight can be input to the vibration arms, contributing to power generation.

It is a matter of course that the energy transmission efficiency n can be increased even further by increasing the input torque T at which the vibration arm is displaced. However, if the input torque T is increased, the chance that the rotation weight will be able to move decreases. Therefore, if the rotation weight cannot move, it is not possible to catch the motion of the user or the like and connect this motion into electric energy. Therefore, it is preferable that the positional relationship between projections 57 and the vibration arms 31 be set so as for the rotation weight to move at an appropriate predetermined torque.

In power generator 10 of this invention, as described above, a predetermined amount of initial displacement can be required to be applied to vibration arms 31 by projections 57 of rotation member 56, thereby enabling the initial electromotive voltage Vof at which a high charging efficiency n can be obtained from piezoelectric layer 32 of vibration arm 31. Further, provision of a plurality of vibration arms 31 around rotation member 56 makes it possible to increase the energy conversion efficiency n as well. As a result, in the power generator of this invention, the kinetic energy obtained by the rotation weight can be efficiently input to the vibration arm, and the electric-charge storage section can be efficiently charged with the electrical energy obtained from the input energy. Therefore, a power generator having an extremely high efficiency and a high power generation performance can be realized.

Moreover, in the power generator of this invention, a plurality of vibration arms are vibrated in sequence, thereby generating electric power. Therefore, since, as shown in FIG. 14, vibrations are excited at different rotation angles in each of vibration arms 31,1 to 31,n of the power generator 10 of this embodiment, the voltages (electromotive voltages) output from the respective vibration anus 31,1 to 31,n at a certain time differ. Therefore, in the power generator 10 of this embodiment, rectifying devices 23,1 to 23,n are provided in correspondence with the individual vibration arms 31,1 to 31,n so that the electric current is prevented from flowing between the vibration arms having different electromotive voltages, causing the voltage actually obtained to decrease. If, in particular, vibration arms whose phases of voltages are opposite to each other were to be directly connected to each other, the phases of the alternating electric current would cancel out, and electric power could not be obtained. Therefore, as shown in power generator 10 of this invention, it is preferable that rectifying devices 23,1 to 23,n be provided for each of vibration arms 31,1 to 31,n so as to prevent reverse current flow and obtain electric power of a predetermined electromotive voltage from the individual vibration arms most efficiently.

Furthermore, in power generator 10 of this invention, the plurality of vibration arms 31,1 to 31,n are connected in parallel by the power lines 58c and 58d via the rectifying devices 23,1 to 23,n so that a large current can be obtained from power generator 10. Although power generator 10 using a piezoelectric element can obtain a relatively high voltage, the current density obtained from the individual piezoelectric elements are very small. Therefore, by connecting a plurality of vibration arms using piezoelectric elements in parallel, as in this embodiment, a large current can be obtained.

Also, in power generator 10 of this embodiment, a reverse flow prevention element, such as diode 91, is provided on one side of capacitor 24 which forms the electric-charge storage device 25 so as to prevent leakage current from electric-charge storage device 25. More specifically, a reverse leak current, though small, is present in the PN junction used in rectifying device 23. For this reason, if a plurality of rectifying devices 23 are connected in parallel, the reverse leak current increases with the number of rectifying devices, possibly causing electric power accumulated in the electric-charge storage device 25 to be lost. Therefore, in wrist watch 30 of this embodiment, reverse current prevention section 90 using reverse flow prevention element 91 is provided on one side of capacitor 24 which forms electric-charge storage device 25. This positioning thereby prevents an increase in the reverse leak current from capacitor 24, which presents a problem when a circuit system in which a plurality of rectifying devices 23 connected in parallel are used.

Also, in wrist watch 30 of this embodiment, complex transmission mechanisms and bearings can be omitted by forming a vibration application apparatus 55 for applying a vibration to the vibration arm 31 of rotation member 56 which moves together in conjunction with rotation weight 53. Further, since a plurality of vibration arms 31 can be arranged around the periphery of rotation member 56, it is easy to provide these vibration arms within case 51. For example, it is possible to house vibration arms 31 and the rotation member 56 in a very narrow space adjacent rear case 52 on an opposite side of display section 7 from rotation weight 53 as is shown in this embodiment. Further, by radially arranging the vibration arms around the periphery of rotation member 56, it becomes easy to employ and arrange vibration arms 31 having a wider width at their support end 34 than at their tip 33, as is shown in this embodiment. Since a wide piezoelectric layer can be provided in a portion where the amount of displacement due to vibration is large by using a vibration arm having a wider width at support end 34, a power generator having a high electromechanical coupling coefficient can be provided, and a higher power generation efficiency can be realized.

The power generator of this embodiment, having a plurality of vibration arms 31 arranged around the peripheral portion of rotation member 56, is not limited to the above-described arrangement, and may be arranged in such a way that the inner peripheral portion of semiconductor substrate 58 is extended inwardly in the shape of comb teeth to form a support layer, and a plurality of piezoelectric layers may be laminated on both sides thereof to form vibration arms 31. Such manufacturing of the semiconductor substrate 58 and the vibration arm 31 into one unit is possible by the known technology for manufacturing integrated circuits, such as CVD. In addition to this example, by extending projections 57 along the direction perpendicular to rotation member 56, it is also possible to apply a displacement in a direction perpendicular to the rotational plane of rotation member 56 to the vibration arms. In addition, a power generator can also be realized in which a vibration application apparatus moves up and down due to vibrations of a vehicle in place of the rotation member 56. In such a case, advantages comparable to those described above can be obtained by arranging a plurality of vibration arms on both sides or on one side of the passage in which the vibration application apparatus moves.

Figure 16:
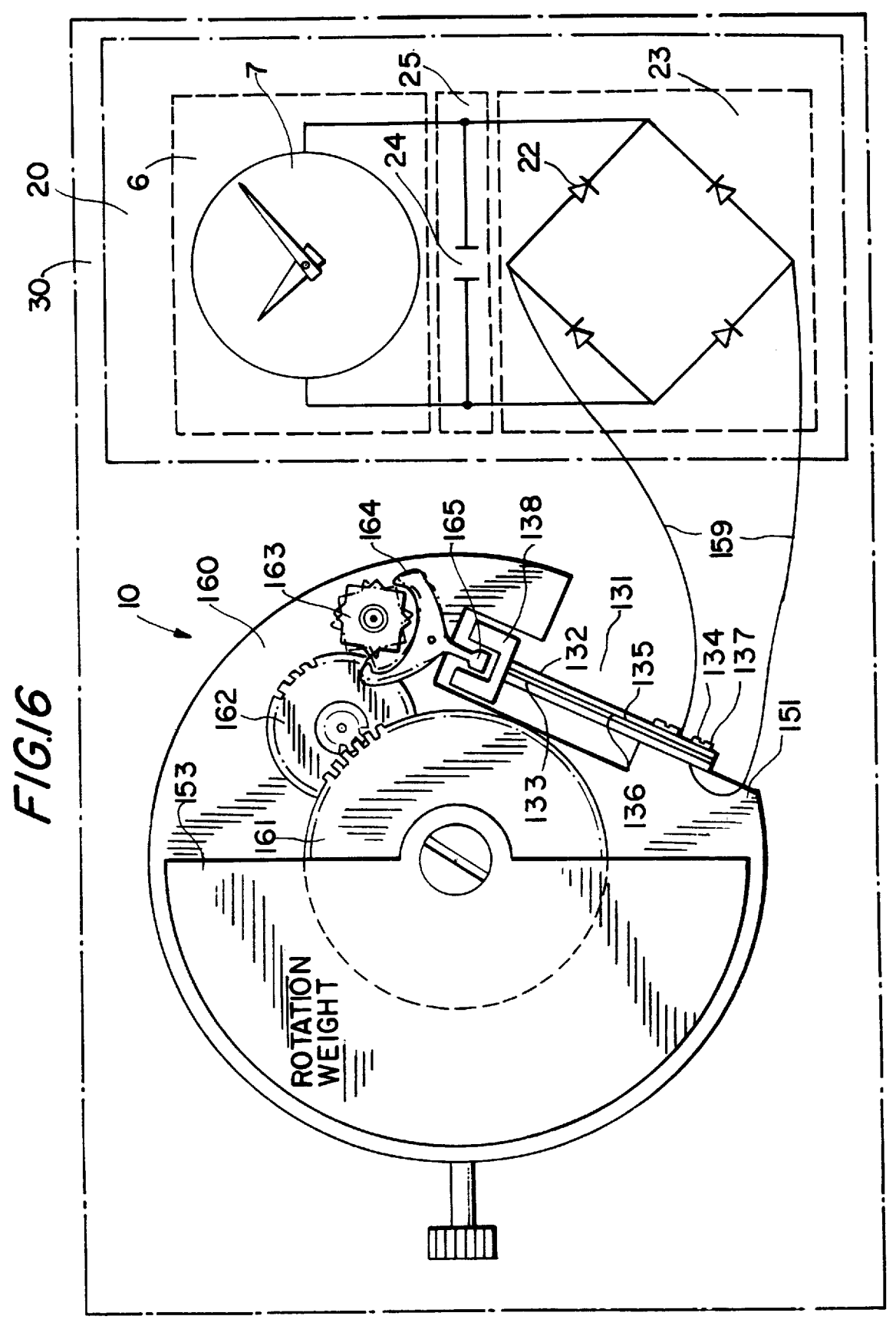

FIG. 16 shows an example of an additional embodiment of an electronic device provided with a power generator different from that described above with respect to the first embodiment. Like elements being designated by like reference numerals. The electronic device of this embodiment is provided with processing unit 6 having timer function 7 in electric power system 20 so that processing unit 6 can be operated by electric power supplied from power generator 10. Electric power system 20 includes a rectifying device 23 for performing fall-wave rectification by using diodes 22 and an electric-charge storage device 25, comprising a capacitor 24 for accumulating rectified electric power coupled in parallel between diodes 22 and timer 7.

Power generator 10 used in wrist watch 30 of this embodiment comprises a vibration arm 131, in the shape of a cantilevered beam, fixed to a case (base plate) 151. Piezoelectric layers 132 are provided on both sides of vibration arm 131 so that electric power generated in these piezoelectric layers 132 can be supplied to electric power system 20 via an electrode 135 and wiring 159 on the surface thereof. A weight 138 is attached at the tip 133 of the vibration arm 131 so that when this weight 138 is moved by a drive system 160 which operates as a displacement application apparatus, a displacement is applied to vibration arm 131. Also, since vibration arm 131 is a cantilevered beam, after it is vibrated by drive system 160, the tip 133 of vibration arm 131 becomes a free end and freely vibrates with, while the opposite end thereof is fixed to the base plate 151 by a screw 137 serving as a support end 134, and the electric power generated thereby in the piezoelectric layer 132 is supplied to electric power system 20.

Drive system 160 of this embodiment has a rotation weight 153 which is rotationally moved inside case 151 in the same way as rotation weight 53 in the above-described power generator. A rotation weight wheel 161 is coupled to weight 153 to rotate therewith. Rotation weight wheel 161 is provided with gear teeth and meshes with an intermediate wheel 162 rotably mounted on base plate 151. A cam drive wheel 163, rotatably mounted on base plate 151, is rotated by intermediate wheel 162. A cam 164 is pivotably mounted on base plate 151 and includes a hitting section disposed within weight 138. Cam driving wheel 163 pivots cam 164 between a first position and a second position.

When rotation weight 153 is attached to a wrist watch or the like, rotation weight 153 rotates in conjunction with the motion of the user's arm or body or the like, and electric power can be generated using the force thereof. The motion of rotation weight 153 is transmitted to an intermediate wheel 162 through a rotation weight wheel 161 and is accelerated. The motion of the intermediate wheel 162 is transmitted to a cam drive wheel 163. A cam 164 is driven from side to side by this cam drive wheel 163, and a hitting section 165 which moves in linkage with the cam 164 housed inside weight 138 of the vibration arm is moved. Therefore, when the user moves his/her arm or body, rotation weight 153 rotates and cam 164 reciprocates parallel to the plane of apparatus 30 as a result of that force. Hitting section 165 of cam 164 hits weight 138 of vibration arm 131, causing weight 138 to be hit repeatedly at appropriate intervals. The respective hittings by hitting section 165 cause a predetermined initial displacement to be applied to vibration arm 131. When cam 164 is released from vibration arm 131, subsequent free vibrations are excited in vibration arm 131. Since these free vibrations cause an electromotive force to be generated in piezoelectric layer 132, this electromotive force can be supplied to electric power system 20 through electrode 135 and the wiring 159.

In the power generator constructed in accordance with this embodiment, the initial displacement applied from hitting section 165 to vibration arm 131 varies due to the pivot speed and pivot range of rotation weight 153. Since the acceleration of hitting section 165 increases if the rotation speed of rotation weight 153 increases, the initial displacement of vibration arm 131 increases similarly and, as a result, the initial value (the initial electromotive voltage) of the voltage generated due to the initial displacement becomes higher. Also, since the number of times that the hitting section 165 hits vibration arm 131 increases, if the pivot range (angle) of rotation weight 153 is increased, the period in which generation of electric power is possible while the rotation weight 153 rotates once is also increased.

Figure 17:
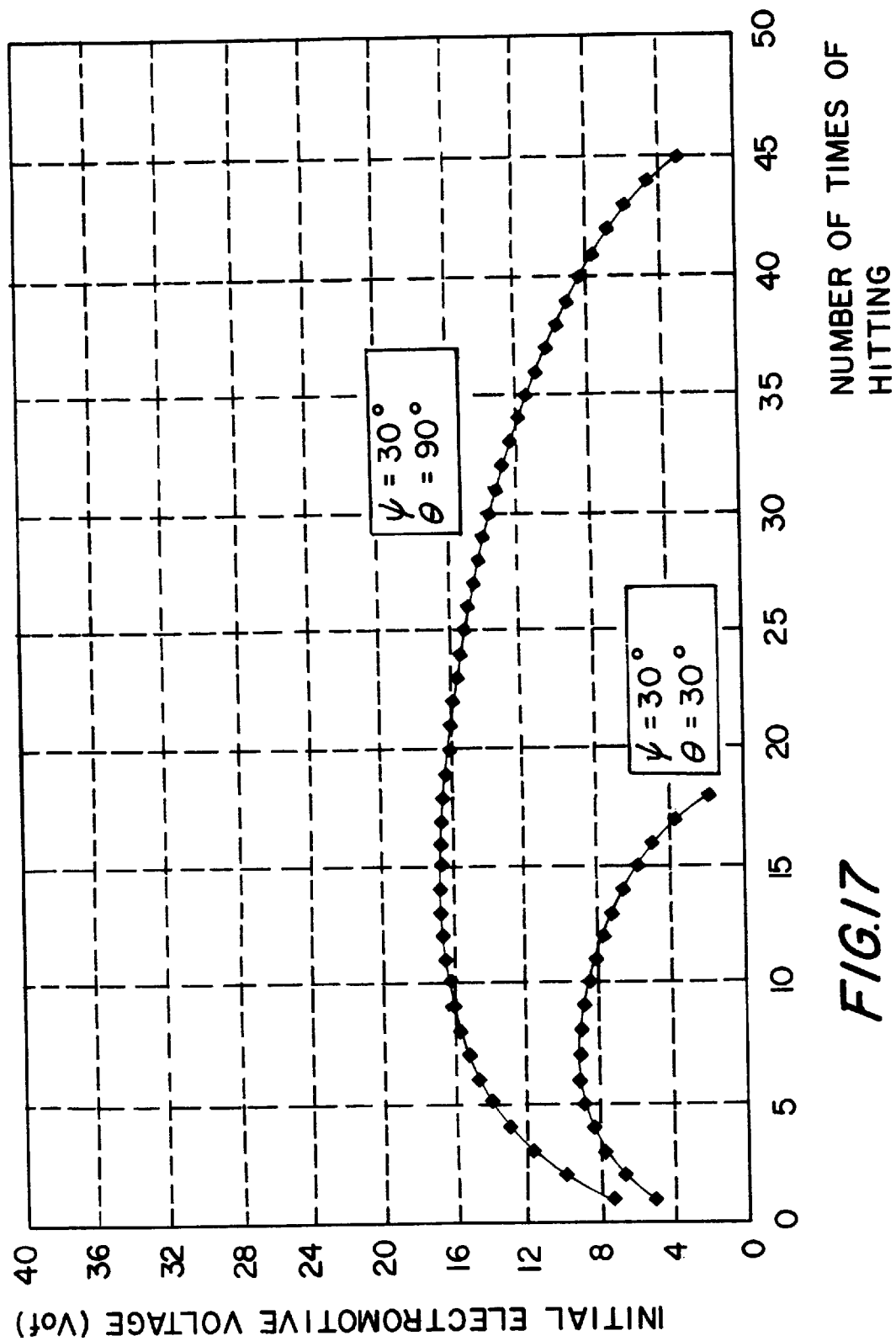
FIG. 17 is a graph depicting the relationship between the number of times the force is generated by the power generator of FIG. 16 and the initial electromotive voltage output by the power generator at those times.

FIG. 17 depicts an example of simulation in which the initial electromotive voltage Vof which is generated is displayed as a function of the number of times the hitting section 165 hits vibration arm 131. Case 1 is depicted in which the inclination angle ψ from the perpendicular direction of the rotation axis of the rotation weight 153 is 30° and the rotational angle θ of the rotation weight 153 is 30°. Case 2 is also depicted in which the inclination angle ψ is 30° and the rotational angle θ is 90°. It has been determined by measuring the operation of the rotation weight, that in these conditions of the rotation weight 153, cases 1 and 2 correspond to +/−25% of the center value of the magnitude of the kinetic energy captured by rotation weight 153. Also, the prescribed voltage Ve at the input electric power system of the power generator was set at 2.0 V, including the charged voltage of the capacitor Vc and the forward voltage of the diode Vd which performs full-wave rectification.

As can be seen in FIG. 17, in case 1, the initial electromotive voltage Vof is 4 V, which corresponds to approximately twice as great as the prescribed voltage Ve, as noted above. This voltage is obtained within the power generation period in which rotation weight 153 rotates through the rotational angle θ, except immediately before rotation weight 153 stops. Further, the highest value of the initial electromotive voltage Vof is approximately 10, corresponding to approximately five times as great as the prescribed voltage Ve. Case 2 shows similar changes: within the power generation period in which rotation weight 153 rotates through the rotational angle θ an initial electromotive voltage Vof of 4 V in which corresponds to twice as great as the prescribed voltage Ve is obtained, except immediately before rotation weight 153 stops. The highest value of the initial electromotive voltage Vof is approximately 18, corresponding to approximately nine times as great as the prescribed voltage Ve. Therefore, in both case 1 and case 2, an initial electromotive voltage Vof of 4 V which corresponds to approximately twice as great as the prescribed voltage Ve is obtained repeatedly with consistency during the power generation period in which rotation weight 153 rotates through rotational angle θ. Also, in both cases, the initial electromotive voltage Vof falls within the range of 4 to 40 V which correspond to 2 to 20 times as great as the prescribed voltage Ve during most of the hittings, except the hittings immediately before rotation weight 153 stops. Further, during most of the hittings, the initial electromotive voltage Vof falls within the range of 4 to 30 V which corresponds to 2 to 15 times as great as the prescribed voltage Ve at which the efficiency is higher, As an initial electromotive voltage Vof which corresponds to 4 to 6 times as great as the prescribed voltage Ve, even higher charging efficiency can be obtained. This performance is obtained repeatedly.

In the power generator of this embodiment of the invention as well in which the hitting section 165 is repeatedly made to hit vibration arm 131 by the rotation of rotation weight 153 in order to generate free vibrations in vibration arm 131, as is shown in FIG. 17, the initial electromotive voltage Vof at which electric power can be generated at a high efficiency can be obtained under the conditions of cases 1 and 2. Electric power can be efficiently generated by capturing the motion of the user or the like, and it is thus possible to provide a power generator capable of supplying electric power to processing unit 6 to operate processing unit 6.

Although in power generator 10 of this embodiment a bimorph-type vibration arm 131 having two layers of piezoelectric layer 132 formed on both sides of a support layer (seam layer) 136, made of a metal, is used, a vibration arm having three or more layers of piezoelectric layer laminated therein may be used, and of course a unimorphtype vibration arm may be also used.

Figure 18:
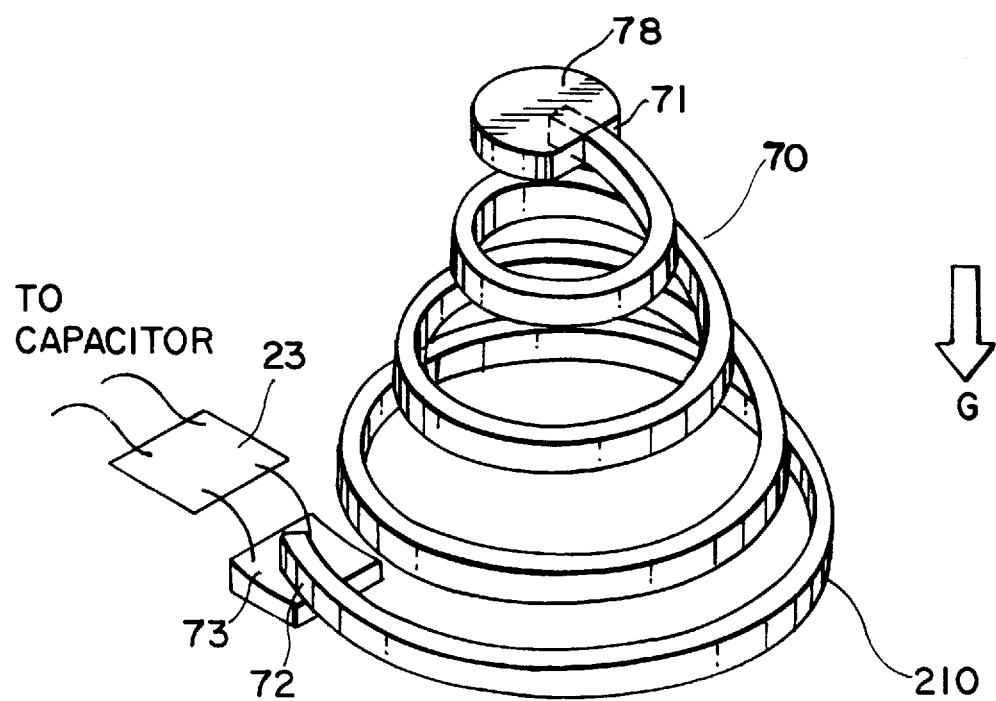
FIG. 18 depicts another example of a power generator constructed in accordance with the invention, in which an initial displacement is applied by a motion of a weight.

FIG. 18 depicts a power generator using a piezoelectric element of an additional embodiment of the invention, which is also capable of generating electric power while freely vibrating. Power generator 210 of this embodiment is an apparatus which is disposed at a place where acceleration varies in a compression and extension (an up and down) direction (the direction indicated by arrow G), such as inside a vehicle, and which is capable of generating electric power by utilizing vertical vibrations. Power generator 210 comprises a piezoelectric element 70 which is formed in the shape of a coil and which is formed into a conical shape in order to secure stability with respect to the directions not coaxial with the coil. A weight 78 is attached at a tip end 71 in the upper portion of coil like piezoelectric element 70. Weight 78 functions as a displacement application apparatus due to the change in the acceleration in the axial direction of the coil (arrow G) so as to apply an initial displacement to piezoelectric element 70 by compression and extension of the coil. Therefore, an electromotive force is generated by this initial displacement in piezoelectric element 70. If the change in the acceleration in the axial direction (arrow G) is stopped, subsequent free vibrations of weight 78 are generated due to the elasticity of the piezoelectric element 70 and weight 78 and thus electric power can be obtained continuously. The electric power generated in piezoelectric element 70 can be transferred from a board 73 which supports a base end 72 in the lower portion of piezoelectric element 70. The electricity can further be supplied through rectifying device 23 to electric power system having a capacitor. Further, it is possible to attach power generator 210 of this embodiment in a dashboard of a vehicle by using board 73.

In the power generator 210 of this embodiment, piezoelectric element 70 is expanded and compressed in conjunction with acceleration applied to weight 78, i.e., in a perpendicular direction (arrow G) in a vehicle which vibrates vertically. Weight 78 which is supported in piezoelectric element 70 is also moved in an up and down direction as a result of this movement. Weight 78 moves in the same direction as the direction of vertical acceleration. Thus, weight 78 is able to consistently follow the vertical vibration of the vehicle, for example, with high accuracy and at high speed, and thus electric power can be stabily generated using piezoelectric element 70. Also, since piezoelectric element 70 is a long and narrow element formed in a coil shape, the displacement applied thereto by the movement of weight 78 is large, and therefore a sufficient amount of power will be generated. Further, in the same way as in the power generator of the prior embodiment, by choosing weight 78 so that the initial electromotive voltage Vof generated by the vertical acceleration of weight 78 is approximately 2 to 20 times as great as the prescribed voltage Ve of the electric power system efficiencies are maximized. More preferably weight 78 should be chosen so that the initial electromotive voltage Vof is 2 to 15 times as great as the prescribed voltage Ve, and still more preferably weight 78 should be chosen so that the initial electromotive voltage Vof is 4 to 6 times as great as the prescribed voltage Ve. Thus, the efficiency of power generation can be increased.

Power generator 210 of this embodiment is able to efficiently generate electric power by setting the balance of the weight 78 in the proper range as described above, and thus is able to generate sufficient electric power. For this reason, power generator 10 is suitable as a power source for any accessories or electronic devices installed in a vehicle. While it is possible to supply electric power to an electronic thermometer or the like via a secondary battery, and the electronic thermometer can be used without being connected to the power supply in the vehicle, such as a cigar liter or the like, if weight 78 and power generator 210 are provided with an electronic thermometer or the like, the apparatus can be used by merely placing the apparatus inside the vehicle. No additional battery or electronic power supply is required.

Also, combining power generator 210 with a large-capacity capacitor or a secondary battery makes it possible for an electronic device requiring a continuous supply of power for operation to use a power generator using a piezoelectric element of the present invention as a power source. In addition, various types of systems can be constructed in which a battery is used only as a back-up power source for RAM or the like and a power generator using a piezoelectric element is used as a power source for the other functions.

Figure 19:
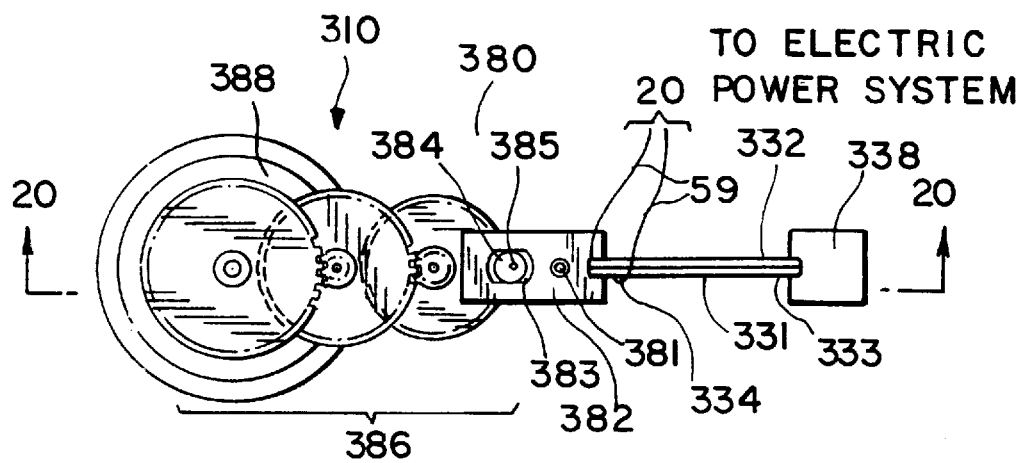
FIG. 19 depicts another example of a power generator constructed in accordance with the invention, in which vibration arms are steadily and consistently vibrated to generate electric power.
Figure 20:
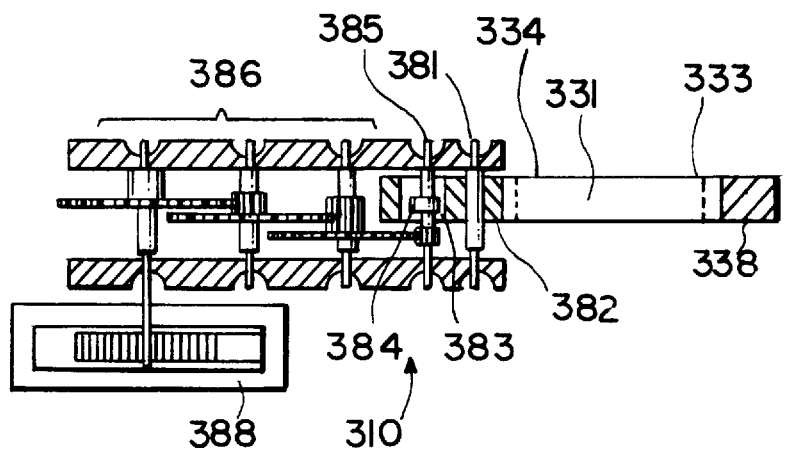
FIG. 20 is a cross-sectional view taken along line 20—20 of FIG. 19.

Referring next to FIGS. 19 and 20, an example of a power generator of a resonance type capable of generating electric power by vibrating a piezoelectric element at a steady displacement (amplitude) is shown. It is a matter of course that it is possible to supply electric power also from the power generator 310 of this embodiment to electric power system 20 provided with a processing unit or to an electric-charge storage unit, and the processing unit of electric power system 20 can be operated by the electric power supplied from power generator 310. An electric power system having the same arrangement as that described in connection with the electronic device 30, such as a wrist watch, can be utilized in this embodiment and, therefore, a description thereof is omitted in this embodiment.

Power generator 310 of this embodiment comprises a vibration arm 331 formed in the shape of a cantilevered beam of a bimorph type having two piezoelectric layers 332 laminated therein. A weight 338 is mounted at a tip 333 of vibration arm 31. A drive system 380 is provided adjacent a support end 334 of vibration arm 333 opposite tip 333, and acts as a displacement application apparatus so as to cause the vibration of arm 331, and excites vibrations of a frequency which are characteristic of vibration arm 331. Vibration arm 331 vibrates continuously at a fixed amplitude.

Drive system 380 comprises a drive plate 382 capable of pivoting about a pivot center 381 in a nearly central portion thereof, with support end 334 of vibration arm 331 being fixed to one end of drive plate 382. Also, a passive window 383 is provided adjacent support end 334 and pivot center 381 being positioned there between. A drive cam 384, formed in the shape of a circular cylinder, has a rotation center 385 at an offset position inside passive window 383. A spring 388 accumulates kinetic energy generated within the apparatus by a weight or other means. Spring 338 is coupled to drive cam 384 by gear train 386 and rotates drive cam 384 as spring 388 releases energy.

Drive cam 384 rotates while being maintained in contact with passive window 383. Therefore, when drive cam 384 rotates, drive plate 382 repeatedly pivots in two directions about pivot center 381, causing support end 334 of vibration arm 331 to be driven in two directions. As a result, vibration arm 331 reciprocates following support end 334. Further, since weight 338 adjacent tip 333 moves, vibration arm 331 is forcibly vibrated. Therefore, by causing drive plate 382 to move at the same frequency as the characteristic frequency of vibration arm 331, and causing support end 334 to reciprocate at the same rate, vibration arm 331 vibrates at a resonance frequency, and steady vibrations with only a small mechanical loss occur.

In drive system 380 of this embodiment, kinetic energy accumulated in a spring 388 is accelerated via a wheel train 386 and transmitted to drive cam 384 so that drive cam 384 rotates at the characteristic frequency. In power generator 310 of this embodiment, since vibration arm 331 vibrates in a resonance state, energy required to drive drive plate 382 only needs to be equal to the amount of energy lost as a result of conversion into electrical energy by piezoelectric layer 332, and the amount of energy lost as a result of conversion into mechanical energy. Since the mechanical loss is very small in a resonance state, most of the energy accumulated in spring 388 can be converted into electrical energy. Since spring 388 can output a fixed torque continuously for a long period of time, it is well suited to vibrate vibration arm 331 at a fixed amplitude for a long period of time. In order to accumulate kinetic energy in the spring 388, it is of course possible to wind the spring by using a rotation weight and also possible to wind the spring manually by the user. Further, it is also possible to accumulate natural energy, such as temperature difference or wind power, then generate electric power from spring 388.

Furthermore, as described above, when vibration arm 31 vibrates in a steady state, by setting the amplitude thereof so that the unloaded voltage Vom is approximately two times as great as the prescribed voltage Ve of electric power system 20, the power generation efficiency of vibration arm 331 can be maximized. Therefore, use of power generator 310 of this embodiment makes it possible to very effectively convert the energy accumulated in spring 388 into electrical energy, and supply the converted energy to an electric power system.

Of course, the method of vibrating vibration arm 331 provided with a piezoelectric layer at a steady state is not limited to this embodiment in which sideways motion is anticipated. Rather a method of fixing vibration arm 331 of this embodiment onto an object which allows vibration arm 331 to vibrate up and down at a resonance frequency, and which forcibly vibrates vibration arm 331 may also be used. By setting the amplitude of the vibration arm 331 during resonance time so that an initial electromotive voltage Vof of approximately two times as great as the prescribed voltage Ve of the electric power system is output, namely, the electromotive voltage in a no-load state is set to be two times as great as the prescribed voltage Ve, vibration energy can be efficiently converted into electrical energy and supplied to the electric power system.

However, initial electromotive voltage cannot always be held at approximately twice as great as the prescribed voltage Ve because of various changes in the situation or positioning of the apparatus. For example, the vibration arm 331 could be disposed either perpendicularly or horizontally, resulting in different vibrations. In such a case, by taking into consideration the fact that maximum power generation efficiency can be obtained when the initial electromotive voltage is approximately twice as great as the prescribed voltage, and by making it possible to obtain an amplitude (displacement) such that this condition is met as often as possible, vibration energy can be efficiently converted into electrical energy.

As has been described up to this point, electric power can be supplied efficiently to an electric power system by setting an initial electromotive voltage at which electric power is generated by applying a displacement to a piezoelectric element that is approximately twice as great as the prescribed voltage of the electric power system which supplies electric power. Preferably this initial electromotive voltage is 2 to 20 times as great as the prescribed voltage Ve when generation of electric power is continued by using subsequent free vibrations of the piezoelectric element which occur after the initial displacement is applied. More preferably the initial electromotive voltage is 2 to 15 times as great as the prescribed voltage Ve, and still more preferably 4 to 6 times as great as the prescribed voltage Ve. By using such a power generation method and power generator, it is possible to supply sufficient electric power to an electric power system and thus to operate a connected processing unit.

Furthermore, by adding a rectifying device and an electric-charge storage unit, such as a large-capacity capacitor, to the electric power system, it is possible to store temporarily the electric power supplied from the power generator and use it as a power source for the processing unit. Thus the processing unit can function consistently and stabily. In particular, since energy of the natural world and energy based on the motion of the user can be converted into electrical energy by using a vibration arm provided with a piezoelectric element, it is possible to provide a portable electronic device which can be used anytime and anyplace by incorporating a power generator and a processing unit, as well as an electric-charge storage unit.

As a processing unit, not only a wrist watch which can be utilized, as described above, but a variety of additional apparatuses may be utilized, such as pagers, portable or other telephones, radios, hearing aids, pedometers, electronic pocket calculators, information terminals such as electronic notebooks, IC cards, radio receivers, and the like. These portable devices can be miniaturized and housed in a pocket or attached to the wrist or other parts of the body by using a band or other attachment device. Thus, it is possible to efficiently and continuously generate electric power due to the motion of the body of a user or the like, and to properly run each device from the generated electric power.

Therefore, the user may use these portable electronic devices without being concerned about rundown of the battery. Thus, for example, the contents stored in memory will never be lost due to rundown of the battery. In addition, it becomes possible for the portable electronic devices to operate in areas or places where batteries and electric-charge storage units cannot be easily obtained or in circumstances in which it is difficult to replenish batteries due to disasters or the like. Further, environmental problems in connection with the disposal of batteries can be avoided.

Although several types of power generators provided with a piezoelectric layer are described in the above described embodiments, the present invention is not limited to the above-described embodiments. It is a matter of course that the present invention can be applied to a power generation method and a power generator using a piezoelectric element of various forms, such as a circular bimorph or film-like piezoelectric element and further a piezoelectric element to which a displacement is applied in a twist direction. In addition, it is a matter of course that a material from which a piezoelectric element is formed is not limited to PZT, and the material may be ceramic materials such as those based on barium titanate and lead titanate, monocrystal piezoelectric elements, such as crystal quartz, or high molecular materials such as PVDF or any other material known in the art.

According to the invention, when electric power is generated through the use of a piezoelectric element, it has been determined that power generation efficiency reaches a maximum when the initial electromotive voltage in an unloaded state is approximately twice as great as the prescribed voltage of the electric power system to which electric power is being supplied. For this reason, in a power generation method and a power generator in which a vibrator provided with a piezoelectric element vibrates in a substantially steady state, namely, in resonance, and generates electric power continuously, it is preferable that the displacement (amplitude) of the vibrator generate an initial electromotive voltage of approximately twice as great as the prescribed voltage.

Moreover, in a power generation method and a power generator in which electric power is generated while a vibrator repeats subsequent free vibrations after being an initial displacement is applied thereto, when power generation efficiency was analyzed as a function of the ratio of the initial electromotive voltage due to the initial displacement to the prescribed voltage, it was determined in the invention that a very high power generation efficiency can be obtained when this ratio is in the range of approximately 2 to 20 times as great. It was also found that the ratio of the initial electromotive voltage to the prescribed voltage should preferably be approximately 2 to 15 times as great, and further, a maximum power generation efficiency can be obtained when the ratio of the initial electromotive voltage to the prescribed voltage is 4 to 6 times as great. Therefore, by generating electric power by using a piezoelectric element under these conditions, it is possible to provide a small-sized, high-efficiency power generator which can be used as a power generator for a portable electronic device or the like. It is further possible to provide an electronic device capable of operating anytime and anyplace by incorporating the power generator of the present invention together with a processing unit or the like.

It will thus be seen that the objects set forth above, among those made apparent from the preceding description, are efficiently attained and, since certain changes may be made in carrying out the above method and in the constructions set forth without departing form the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method for generating electric power using a piezoelectric element which produces a voltage upon displacement for supplying generated electric power to an electric power system, said electric power generation method comprising the step of:

applying a displacement to a piezoelectric element to produce a voltage corresponding to an unloaded voltage output of the piezoelectric element, when an electrical load is not connected thereto, that is approximately twice as great as a prescribed voltage of said electric power system.

2. The electric power generation method of claim 1, wherein said displacement application step is repeated at a high frequency while electric power is being supplied from said piezoelectric element.

3. A method for generating electric power using a piezoelectric element for supplying electric power generated as a result of a displacement of an piezoelectric element to an electric power system, said electric power generation method comprising the steps of:

(a) applying a displacement to a piezoelectric element corresponding to an unloaded voltage output of the piezoelectric element when an electrical load is not connected thereto, which is at least approximately twice as great as a prescribed voltage of said electric power system, said displacement application causing an initial displacement and subsequent free vibrations in said piezoelectric element; and (b) supplying electric power to an electric power system wherein electric power is generated in said piezoelectric element by said initial displacement and said subsequent free vibrations caused thereafter.

4. The electric power generation method of claim 3, wherein said unloaded voltage due to said initial displacement is in the range of approximately two to twenty times as great as said prescribed voltage.

5. The electric power generation method of claim 3, wherein said unloaded voltage due to said initial displacement is in the range of approximately two to fifteen times as great as said prescribed voltage.

6. The electric power generation method of claim 3, wherein said unloaded voltage due to said initial displacement is in the range of approximately four to six times as great as said prescribed voltage.

7. The electric power generation method of claim 3, further comprising repeating said displacement application step and said electric power supply step at a high frequency while electric power is being supplied from said piezoelectric element.

8. An electric power generator comprising:
a piezoelectric element;
a displacement applicator for applying a displacement to a piezoelectric element; and
an electric power supplier for supplying electric power generated in said piezoelectric element to an electric power system, wherein said displacement application means is adapted to apply a displacement to said piezoelectric element corresponding to an unloaded voltage output by said piezoelectric element having a voltage when an electrical load is not connected thereto which is approximately twice as great as a prescribed voltage of said electric power system.

9. The electric power generator of claim 8, wherein said displacement applicator applies said displacement at a high frequency such that said unloaded voltage is approximately twice as great as said prescribed voltage during each displacement application.

10. An electric power generator, comprising:
a piezoelectric element;
a displacement applicator for applying a displacement to said piezoelectric element; and
an electric power supplier for supplying electric power generated by said piezoelectric element to an electric power system, wherein said displacement applicator selectively applies a displacement to said piezoelectric element corresponding an unloaded voltage output by said piezoelectric element, which is the voltage when an electrical load is not connected thereto, which is approximately twice as great as a prescribed voltage of said electric power system, said initial displacement causing subsequent free vibrations in said piezoelectric element.

11. The electric power generator of claim 10, wherein said displacement applicator applies said initial displacement such that said unloaded voltage is approximately two to twenty times as great as said prescribed voltage.

12. The electric power generator of claim 10, wherein said displacement applicator applies said initial displacement such that said unloaded voltage is approximately two to fifteen times as great as said prescribed voltage.

13. The electric power generator of claim 10 wherein said displacement applicator applies said initial displacement such that said unloaded voltage is approximately four to six times as great as said prescribed voltage.

14. The electric power generator of claim 10, wherein said displacement applicator selectively repeatedly applies said initial displacement at a high frequency and said unloaded voltage is approximately two times as great as said prescribed voltage.

15. An electronic device, comprising:
an electric power generator including a piezoelectric element, a displacement applicator for applying a displacement to said piezoelectric element, an electric power supplier for supplying electric power generated in said piezoelectric element to an electric power system, wherein said displacement applicator displaces said piezoelectric element an amount corresponding to an unloaded voltage output by said piezoelectric element, which is the voltage when an electrical load is not connected thereto, which is approximately twice as great as a prescribed voltage of said electric power system;
means coupled to said electric power supplier, for rectifying electric power supplied from the electric power generator;
electric-charge storage means coupled to said rectifying means, for accumulating said rectified electric power; and
a processing unit, coupled to said rectifying means, and operate utilizing said rectified electric power.

16. An electronic device, comprising:
a piezoelectric element;
a displacement applicator for applying a displacement to said piezoelectric element;
an electric power supplier for supplying electric power generated by said piezoelectric element to an electric power system, wherein said displacement applicator selectively applies a displacement to said piezoelectric element corresponding to an unloaded voltage output by said piezoelectric element, which is the voltage when an electrical load is not connected thereto, which is approximately twice as great as a prescribed voltage of said electric power system, said initial displacement causing subsequent free vibrations in said piezoelectric element;
means coupled to said electric power supplier, for rectifying electric power supplied from said electric power generator;
electric-charge storage means, coupled to said rectifying means for accumulating said rectified electric power; and
a processing unit, coupled to said rectifying means, and operated by using said rectified electric power.

17. The electronic device of claim 16, wherein said electric power generator further comprises at least one vibrator to which said piezoelectric elements are fixed.

18. The electronic device of claim 17, wherein said at least one vibrator includes a plurality of vibrators, said plurality of vibrators being positioned radially.

19. The electronic device of claim 18, wherein said vibrators are positioned radially about a rotation weight.

20. The electronic device of claim 16, wherein said piezoelectric element is formed as a coil.

21. The electronic device of claim 20, wherein said coil has a first end and said displacement applicator is a weight affixed to said first end.

22. The electronic device of claim 16 wherein said piezoelectric element is formed as a strip.

23. The electronic device of claim 22, wherein said piezoelectric element is formed with a weight at an unattached end thereof in a hammer like shape, said weight applying an alternating transverse displacement to said piezoelectric element.

24. The electronic device of claim 23, further comprising a cam for controlling and alternating the movement of said weight.

25. The electronic device of claim 16, wherein said piezoelectric element is formed with a weight at an unattached end thereof.

26. The electronic device of claim 25, further comprising a spring applying a consistent alternating displacement to said weight.

* * * * *